US006839800B2

(12) United States Patent
Stark

(10) Patent No.: US 6,839,800 B2
(45) Date of Patent: Jan. 4, 2005

(54) RAM-BASED RANGE CONTENT ADDRESSABLE MEMORY

(75) Inventor: Moshe Stark, Even Yehuda (IL)

(73) Assignee: Hywire Ltd., Netanya (IL)

( * ) Notice: Subject to any disclaimer, the term of this patent is extended or adjusted under 35 U.S.C. 154(b) by 299 days.

(21) Appl. No.: 10/229,065

(22) Filed: Aug. 28, 2002

(65) Prior Publication Data

US 2003/0093646 A1 May 15, 2003

Related U.S. Application Data

(63) Continuation-in-part of application No. PCT/IL01/01025, filed on Nov. 5, 2001.

(51) Int. Cl.[7] .............................................. G06F 12/00

(52) U.S. Cl. ........................................ 711/108; 365/49

(58) Field of Search ............................ 711/108; 365/49

(56) References Cited

U.S. PATENT DOCUMENTS

| | | | | |
|---|---|---|---|---|
| 4,791,606 | A | | 12/1988 | Threewitt et al. ............. 365/49 |
| 4,928,260 | A | | 5/1990 | Chuang et al. ............... 365/49 |
| 5,383,146 | A | | 1/1995 | Threewitt ..................... 365/49 |
| 5,920,886 | A | * | 7/1999 | Feldmeier ................... 711/108 |
| 5,949,696 | A | | 9/1999 | Threewitt .................... 365/49 |
| 6,237,061 | B1 | * | 5/2001 | Srinivasan et al. ......... 711/108 |
| 6,374,325 | B1 | | 4/2002 | Simpson et al. ............ 711/108 |
| 6,389,507 | B1 | * | 5/2002 | Sherman ..................... 711/108 |
| 6,606,681 | B1 | * | 8/2003 | Uzun .......................... 711/108 |
| 6,633,953 | B2 | * | 10/2003 | Stark .......................... 711/108 |
| 6,697,276 | B1 | * | 2/2004 | Pereira et al. ................ 365/49 |
| 6,728,124 | B1 | * | 4/2004 | Ichiriu et al. ................. 365/49 |

FOREIGN PATENT DOCUMENTS

WO      WO01/91132      11/2001

OTHER PUBLICATIONS

R.E. Hodson, et al, "CNU/CEBAF/NASA Collaboration, Content Addressable Memory (CAM)", http://www.pcs.cn-u.edu/~rhodson/cam/camPage.html.
Netlogic Microsystems Introduces Family of Content Addressable Memory Products for Network Systems, Netlogic Microsystems Inc., Aug. 24, 1998.
Netlogic Application Note NCS01: "How CAMs Ease Router–Table Designs", Revision 1.1.
SiberCore Technologies: SiberCAM™ Family Large Capacity Content Addressable Memory Feature List, Apr. 1999.
J. Postel: "Internet Protocol", Sep. 1981, IETF, RFC 0760.
V. Fuller, et al., "Classless Inter–Domain Routing", IETF, RFC 1519, Jun. 1993.
Karanjit S. Siyan, "Inside TCP/IP, A Comprehensive Introduction to Protocols and Concepts", New Riders Publishing, 1997.
UTMC Microelectronic Systems: "UTCAM EngineTM LPM", Nov. 1988.
K. S. Siyan; V. Lakshman, Dimitrios Stiliadis, "High–Speed Policy–Based Forwarding Using Efficient Multi–Dimensional Range Matching", SIGCOM 1998, pp. 203–214.

(List continued on next page.)

Primary Examiner—Nasser Moazzami
(74) Attorney, Agent, or Firm—Mark M. Friedman

(57) ABSTRACT

A method for arranging and storing data in a memory and for extracting the data from the memory in response to an input key, including the steps of (a) providing at least a first array having at least two dimensions, the first array consisting of rows and columns, the first array for storing a plurality of range boundary information; (b) providing at least a second array having at least two dimensions, the second array consisting of rows and columns, the second array for storing a plurality of associated data entries; (c) processing sets of range information to produce, for each of the sets: (i) range boundary information including at least one range-boundary value, the range boundary information being associated with a particular one of the associated data entries, and (ii) range validity information, and (d) storing the range boundary information within the first array.

56 Claims, 20 Drawing Sheets

OTHER PUBLICATIONS

Pankaj Gupta et al., "Packet Classisfication on Multiple Fields", Proceedings of ACM SIGCOMM, Sep. 1999, pp. 147–160.

Pankaj Gupta, Stanford University Ph.D Dissertation, "Algorithms for Routing Lookups and Packet Classification", Dec. 2000.

Gupta; Farhad Shafai et al., "Fully Parallel 30–MHz, 2.5Mb CAM", IEEE JSSC vol. 33 No. 11, Nov. 1998, pp. 1690–1696.

Devarat Shah et al., "Fast Incremental Updates on Ternary CAMs for Routing Lookups and Packet Classification", Proceedings of Hot Interconnects VIII, Aug. 2000.

Anthony J. McAuley et al., "Fast Routing Table Lookup Using CAMs", and IEEE INFOCOM '93, vol. 3, pp. 1382–1391, Mar. 1993.

UTMC Microelectronic Systems: "UTCAM Engine™ LPM", Nov. 1988.

* cited by examiner

RAM-BASED RANGE CONTENT ADDRESSABLE MEMORY

This is a continuation-in-part of PCT Application Ser. No. IL01/01025, filed Nov. 15, 2001.

FIELD AND BACKGROUND OF THE INVENTION

The present invention relates to Range Content Addressable Memory and, more particularly, to a system for, and method of, implementing a RAM-Based Range Content Addressable Memory.

Conventional memory arrays such as Random Access Memories (RAMs) store and retrieve data units indexed by their address.

Content Addressable Memories (CAMs), on the other hand, are associative memories that contain Key Entries and Associated Data Entries that uniquely correspond to the Key Entries. A CAM stores the key entries and the associated data entries at any available location and retrieves the Associated Data for any key that is submitted to be searched in the CAM.

Associative fast operation requires parallelism, such that the Submitted Key is searched concurrently in all CAM location. This requires the incorporation of comparators in each memory cell (see, for example, M. D. Pepler, et al., "Dataflow Token Matching Using Pipelined Content Addressable Memory", May 1998, http://www.elec-eng.leeds.ac.uk/pgrad/eenmdp/paperl.html; R. E. Hodson, et al, "CNU/CEBAF/NASA Collaboration, Content Addressable Memory (CAM)", http://www.pcs.cnu.edu/~rhodson/cam/camPage.html; Chuang, et al, U.S. Pat. No. 4,928,260), which makes a CAM cell bigger and slower in comparison to a RAM cell. Consequently, CAM chips are usually expensive, and are also characterized by small memory capacity (see "Netlogic Microsystems Introduces Family of Content Addressable Memory Products for Network Systems", Netlogic Microsystems Inc., Aug. 24, 1998.).

Attempts to use software to make RAMs operate in an associative manner lead to speed limitations, since each associative reference typically requires many RAM accesses and many processor cycles. Nevertheless, for many applications, processor and RAM speed improvements have kept pace with application speed requirements. In many more natural CAM applications, especially those that require massive amounts of memory, CAM implementation has not been successful due to the lack of fast, dense and inexpensive CAMs.

In spite of its limitations, CAMs have been utilized in the communications industry, because a RAM with a software shell cannot achieve the speed required for an associative lookup. Despite the recent major improvements made in the CAM density and speed (see Netlogic Application Note NCS01: "How CAMs Ease Router-Table Designs", Revision 1.1; SiberCore Technologies: SiberCAM™ Family Large Capacity Content Addressable Memory Feature List", April 1999; UTMC Microelectronic Systems: "UTCAM Engine™ LPM", November 1988), the inherent density problems coupled with the high cost have limited the use of the CAMs to the most speed-critical applications, such as routing and switching in data communications.

U.S. Pat. No. 4,928,260 to Chuang, et al., among others (e.g., J. Postel: "Internet Protocol", September 1981, IETF, RFC 0760; V. Fuller, et al., "Classless Inter-Domain Routing", IETF, RFC 1519, June 1993; Karanjit S. Siyan, "Inside TCP/IP, A Comprehensive Introduction to Protocols and Concepts", New Riders Publishing, 1997) disclose that the main drawback of modern CAMs lies in the design of the CAM basic cell circuit, due to the limitations of the cell packing and performance.

One approach was to build a much bigger RAM-based CAM system using RAM technology (see UTMC Microelectronic Systems: "UTCAM Engine™ LPM", November 1988). However, this CAM system is of mediocre performance due to the limitations imposed by the RAM components, specifically by their limited bus bandwidth.

Another approach, disclosed by U.S. Pat. No. 5,949,696, utilizes a dynamic CAM, in which each cell contains a comparator connected to the match line output. The match line output outputs first and second logic states in response to different and similar logic states, respectively. The CAM cell also includes a first storage element having an input connected to a first data input line, and an output connected to the comparator, a second storage element having an input connected to a second data input line, and an output connected to an input of the comparator. The cell stores masked states by storing similar logic states in both storage elements. Isolation between the match line output and the storage elements is obtained by eliminating direct connection between the match line output and the storage elements.

U.S. Pat. No. 4,791,606 discloses a dynamic CAM having N and P channel transistors aligned in stripes for providing dense packing. Each cell includes an XOR-gate for comparing a stored data bit with a comparand bit. Each pair of neighboring rows and each pair of neighboring columns is arranged symmetrically, for improving the packing density.

U.S. Pat. No. 5,383,146 discloses a memory array that is partitioned into CAM and RAM subfields by disabling the comparator in each memory cell in the selected column of CAM cells to create RAM-functioning cells. The comparators in the RAM-functioning cells can be re-enabled, so that these cells may participate in subsequent comparisons to a search word. This arrangement allows direct retrieval and storage of associated data in RAM-functioning cells that correspond to data words that are determined to match a given search word.

It must be emphasized that the CAM cells disclosed in the above-referenced patents are still relatively complex and occupy large areas in comparison with RAM cells of similar technology. The cited prior art does not enable the implementation of a fast, dense, high-capacity, power-efficient and inexpensive CAMs using RAM-based technology.

A successful approach to utilizing RAM-based technology on a binary CAM is provided in my co-pending, unpublished (and as such, is not to be construed as prior art with regard to the present application) PCT Patent Application Ser. No. IL01/00458, which is incorporated by reference for all purposes as if fully set forth herein. A method and apparatus are disclosed therein for the high-rate arrangement, storage and extraction of data in a two-dimensional memory array. The two-dimensional array, which consists of memory cells, is arranged in rows and columns, each of the key entries in these cells having a unique pair of indices that indicate the key entry location in the array. The associated data entries that correspond to these key entries are stored in another two-dimensional array under the same pair of indices. When a submitted key is searched and found, the associated data is retrieved from the corresponding cell in the other two-dimensional associated-data memory array and a match signal, "True" or "False", is also output with the retrieved associated data entry to indicates whether the associated data is valid or not. The entries in each two-dimensional array are arranged, each entry in a separate cell, in rows or columns, in a subsequent ascending or descending order. The entries are arranged in the array so that at least a portion of the array is filled without blanks with valid entries. The key and associated data entries are arranged and stored in the arrays prior to submission of a key for search.

The main innovations introduced by these devices are:

Surrounding the RAM structure with search logic in the RAM periphery: The number of comparator units is proportional to the RAM periphery length rather than to the RAM area. This results in dramatic savings in the amount of comparator logic, while keeping the memory cell extremely efficient in density and speed. The CAM implementation overhead is typically less than 15%. Therefore, the CAM density obtained with this method is asymptotically close to the comparable size in RAM technology.

Fast Search Algorithm: The surrounding logic in conjunction with the RAM structure performs searches with the same throughput as a comparable RAM, and twice the latency. (Theoretically, single clock latency may be accomplished, but pipelining may yield a better throughput and a similar latency if measured on absolute time scale (nano-seconds).

Continuous "Housekeeping" Procedure: Unlike CAMs of the prior art, these CAM devices keep the "house in order". That is, the deletion of keys does not leave "holes" in the list, which would otherwise require "housekeeping" operations on the managing processor section. Similarly, the addition of new keys keeps the list in a perfect sequence. This "housekeeping" procedure takes longer than the search, but is much faster than required by the system. The overhead associated with the Key List update is significantly shorter when compared with the time taken by the processor to do the housekeeping. This superior performance is due to the efficient RAM and Insert/Remove hardware architecture, which execute very time-efficient algorithms.

SUMMARY OF THE INVENTION

The present invention is a RAM-Based Range Content Addressable Memory (RCAM). The RCAM stores Range Key Entries that represent ranges of integers and Associated Data Entries that correspond uniquely to these ranges.

According to one aspect of the present invention, there is provided a method for arranging and storing data in a memory and for extracting the data from the memory in response to an input key, including the steps of (a) providing at least a first array having at least two dimensions, the first array consisting of rows and columns, the first array for storing a plurality of range boundary information; (b) providing at least a second array having at least two dimensions, the second array consisting of rows and columns, the second array for storing a plurality of associated data entries; (c) processing sets of range information to produce, for each of the sets: (i) range boundary information, the range boundary information including at least one range-boundary value, the range boundary information being associated with a particular one of the associated data entries, and (ii) range validity information, and (d) storing the range boundary information within the first array.

According to another aspect of the present invention, there is provided a method for extracting the data from the memory in response to an input key, the method including the steps of: (a) providing at least a first array having at least two dimensions, the first array consisting of rows and columns, the first array having a plurality of range boundary information, each range boundary information corresponding to a particular range; (b) providing at least a second array having at least two dimensions, the second array consisting of rows and columns, the second array having a plurality of associated data entries, each of the data entries being associated with a particular one of the range boundary information; (c) providing range validity information for each of the range boundary information; (d) comparing a value of an input key with the range boundary information to determine a particular range to which the input key belongs.

According to another aspect of the present invention, there is provided a device for storing arranged data in a memory, and for extracting the data therefrom, the device including: (a) a random access memory including: (i) a first array of cells, the first array having at least two dimensions and consisting of rows and columns, the first array containing a plurality of range boundary information, each range boundary information corresponding to a particular range, each of the cells having a unique address and being accessible via an input key; (ii) a second array of cells, the second array having at least two dimensions and consisting of rows and columns, the second array having a plurality of associated data entries, and (iii) range validity information for each of the range boundary information, the range validity information stored within the memory; wherein the memory is designed and configured such that each of the data entries is associated with a particular one of the range boundary information, and (b) processing means designed and configured to examine, in response to the input key, the range boundary information, so as to determine if the input key falls within any range.

According to one feature of the present invention, described in the preferred embodiments, the range boundary information is a single range-boundary value.

According to another feature of the present invention, described in the preferred embodiments, each range-boundary value has a unique pair of row and column indices for indicating a unique pair of row and column indices of the particular one of the associated data entries.

According to yet another feature of the present invention, described in the preferred embodiments, the range validity information corresponding to each set is a boundary status of the set.

According to yet another feature of the present invention, described in the preferred embodiments, the method further includes the step of: (e) arranging each range boundary value in a separate memory cell of the first array, to produce a monotonic order.

According to yet another feature of the present invention, described in the preferred embodiments, if the boundary status is open, a range defined by the particular range boundary information is an invalid range.

According to yet another feature of the present invention, described in the preferred embodiments, if the boundary status is closed, a range defined by the particular range key is a valid range.

According to yet another feature of the present invention, described in the preferred embodiments, the monotonic order is filled starting from a single row or column.

According to yet another feature of the present invention, described in the preferred embodiments, the first array is completely filled with the range boundary information.

According to yet another feature of the present invention, described in the preferred embodiments, the first array is transposed.

According to yet another feature of the present invention, described in the preferred embodiments, the method further includes the step of: (e) comparing a value of an input key with the range boundary information to determine a particular range to which the input key belongs.

According to yet another feature of the present invention, described in the preferred embodiments, the method further includes the step of: (t) if the value of the input key falls within a particular range defined by the range boundary information, determining if the particular range is a valid range.

According to yet another feature of the present invention, described in the preferred embodiments, the method further includes the step of: (g) if the particular range is a valid range, retrieving from the associated data entries, a data entry associated with the range boundary information of the particular range.

According to yet another feature of the present invention, described in the preferred embodiments, the method further includes the step of: (g) if the particular range is a valid range, producing a match signal.

According to yet another feature of the present invention, described in the preferred embodiments, the method further includes the step of: (g) if the range of consecutive values is not a valid range, producing a no-match signal.

According to yet another feature of the present invention, described in the preferred embodiments, each of the associated data entries has a unique pair of row and column indices for association with a unique pair of row and column indices of a particular one of the range boundary information.

According to yet another feature of the present invention, described in the preferred embodiments, the range boundary information is a single range-boundary value.

According to yet another feature of the present invention, described in the preferred embodiments, each of the range validity information is contained within the first array, each range validity information corresponding to a particular single range-boundary value.

According to yet another feature of the present invention, described in the preferred embodiments, the range validity information is stored in a separate array.

According to yet another feature of the present invention, described in the preferred embodiments, each range validity information is contained within the second array, each range validity information corresponding to a particular one of the associated data entries.

According to yet another feature of the present invention, described in the preferred embodiments, the associated range validity information has a unique pair of row and column indices for association with a unique pair of row and column indices of a particular one of the associated data entries.

According to yet another feature of the present invention, described in the preferred embodiments, a row or column containing the range boundary information is selected by the following steps: (i) performing a comparison between the range boundary information and the input key to produce a result, and (ii) identifying a row or column in which the result undergoes a change in inequality status.

According to yet another feature of the present invention, described in the preferred embodiments, the method further includes the step of: (iii) selecting the row or column.

According to yet another feature of the present invention, described in the preferred embodiments, the memory is selected from the group of memories consisting of: SRAM, DRAM, CCD, ROM, EPROM, E$^2$PROM, Flash memory, and magnetic media.

According to yet another feature of the present invention, described in the preferred embodiments, the rate of key lookups of the range boundary information is increased by concurrently: (i) identifying a location of the input key in a row which has been previously identified and selected, and (ii) identifying and selecting a row that may contain a subsequently submitted input key.

According to yet another feature of the present invention, described in the preferred embodiments, the method further includes the step of: (e) identifying a row into which the new range boundary value should be inserted and selecting the row, and (f) inserting a new range boundary value into an insertion location in the first array while maintaining a monotonic order of the plurality of range boundary information.

According to yet another feature of the present invention, described in the preferred embodiments, the identifying in step (e) includes a comparison of the new range boundary value with the range boundary information disposed in an end column in the first array.

According to yet another feature of the present invention, described in the preferred embodiments, the method further includes the step of: checking that the new range boundary value is not already enlisted is the first array.

According to yet another feature of the present invention, described in the preferred embodiments, the method further includes the step of: identifying a column index for the new range boundary value by performing a comparison of the new range boundary value with the range boundary information disposed in the row.

According to yet another feature of the present invention, described in the preferred embodiments, the maintaining of a monotonic order is achieved by shifting a content of each cell disposed after the insertion location respectively, by one position, thereby completely filling at least a portion of the array with the boundary entries.

According to yet another feature of the present invention, described in the preferred embodiments, the method further includes the steps of: identifying a row from which a particular range boundary value should be removed and selecting the row, and removing the particular range boundary value from a removal location in the first array while maintaining a monotonic order of the plurality of range boundary information.

According to yet another feature of the present invention, described in the preferred embodiments, the identifying of a row from which a particular range boundary value should be removed includes a comparison of the new range boundary value with the range boundary information disposed in an end column in the first array.

According to yet another feature of the present invention, described in the preferred embodiments, the method further includes the step of: identifying a column index for the particular range boundary value by performing a comparison of the particular range boundary value with the range boundary information disposed in the row.

According to yet another feature of the present invention, described in the preferred embodiments, the maintaining of a monotonic order is achieved by shifting a content of each cell disposed after the removal location respectively, by one position, thereby completely filling at least a portion of the array with the boundary entries.

According to yet another feature of the present invention, described in the preferred embodiments, the device of claim 46, further includes: sorting means for arranging the range boundary information in monotonic order within the first array.

According to yet another feature of the present invention, described in the preferred embodiments, the processing means include: a row locator containing at least a first comparator, for comparing contents of an end column of the first array with the input key and for identifying a row that may contain a particular range boundary information corresponding to a range containing the input key.

According to yet another feature of the present invention, described in the preferred embodiments, the processing means further include: a column locator containing at least a second comparator, for comparing contents of the row with the input key and for identifying a column containing the particular range boundary information corresponding to the range containing the input key.

The advantages of the RCAM of the present invention over conventional binary CAMs are manifestly evident from the development presented hereinbelow. Moreover, the RAM-Based RCAM of the present invention utilizes RAM technology to implement RCAM circuits.

Unlike the prior art, where the innovation lies in the CAM cell optimization, the present invention achieves superior results through innovative architecture around RAMs, and using novel algorithms. The RAMs utilized for the implementation of the RCAMs can be standard, inexpensive, off-the-shelf RAM components (e.g., ordinary static RAMs or dynamic RAMs).

Although the preferred embodiment is to embed the RAM structure and the surrounding Search and Key List maintenance hardware on the same piece of silicon, the CAM system can be implemented with standard RAM components, limited by the bandwidth of the required control logic, which originates from the number of pins in the package and the transfer rate. Furthermore, these architecture and algorithms are not limited to a certain memory technology or process.

RAM-Based RCAMs of the present invention provide:

High density, and therefore a low cost per bit.

High performance, reflected in an ultra-high search throughput.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 2 is a schematic illustration of a 2-dimensional M-column by N-row memory array;

FIG. 5 is a schematic illustration of step 1 in a Sequential Key Search in a Two-Dimensional Array (TDA)—Row Location;

DESCRIPTION OF THE PREFERRED EMBODIMENTS

Figure 1:
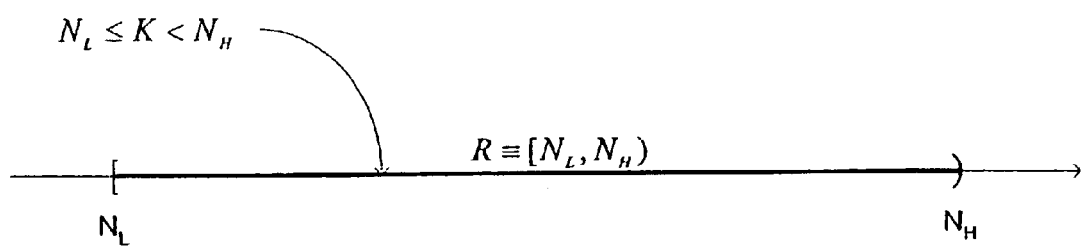
FIG. 1 is a graphical representation of a range.

The present invention is a RAM-Based Range Content Addressable Memory (RCAM). The principles and operation of the RAM-Based RCAM may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawing. The invention is capable of other embodiments or of being practiced or carried out in various ways. Also, it is to be understood that the phraseology and terminology employed herein is for the purpose of description and should not be regarded as limiting.

In my co-pending, unpublished (and as such, is not to be construed as prior art with regard to the present application) PCT Patent Application Ser. No. IL01/00595, which is incorporated by reference for all purposes as if fully set forth herein, a method and apparatus are disclosed for arranging and storing a set of key entries and a corresponding set of associated data entries in two storage areas within a memory device. Each location in the first storage area is assigned a unique index and is associated with the corresponding location to second storage area with the same index. Each key entry represents a range of consecutive values and is denoted herein as Range Key Entry. The range may be represented by its lower or upper boundary.

When a key is submitted for search and is found to belong to a range represented by a range key entry, the associated data entry with the same index is extracted from the memory as valid data and a Match signal is issued. If no range is found to contain the submitted key, no valid associated data is retrieved and a No-Match signal is issued.

The RAM-based RCAM of the present invention is particularly suited to many important applications. The RCAM can be efficiently deployed to implement Classless Inter Domain Routing (CIDR) (see, inter alia, J. Postel; V. Fuller et al.; K. S. Siyan; H. C. Berkowitz) and to classify Internet packets (see V. Lakshman, Dimitrios Stiliadis, "High-Speed Policy-Based Forwarding Using Efficient Multi-Dimensional Range Matching", SIGCOM 1998, pp. 203–214; Pankaj Gupta et al., "Packet Classification on Multiple Fields", Proceedings of ACM SIGCOMM, September 1999, pp. 147–160; Pankaj Gupta, Stanford University Ph.D. Dissertation, "Algorithms for Routing Lookups and Packet Classification", December 2000). The innovation lies both in the RCAM concept and in the RAM implementation for these applications.

These applications have been implementable, until now, using Ternary CAMs (TCAMs) (see, inter alia, the above-referenced Ph.D. Dissertation by Gupta; Farhad Shafai et al., "Fully Parallel 30-MHz, 2.5 Mb CAM", IEEE JSSC Vol. 33 No. 11, November 1998, pp. 1690–1696; Devavrat Shah et al., "Fast Incremental Updates on Ternary CAMs for Routing Lookups and Packet Classification", Proceedings of Hot Interconnects VIII, August 2000; Anthony J. McAuley et al., "Fast Routing Table Lookup Using CAMs", and IEEE INFOCOM 93, Vol. 3, pp. 1382–1391, March 1993). The RCAM offers much higher performance, much lower power dissipation, and data aggregation, which results in reduced storage space.

A review of RCAM fundamentals is provided herein below:

RCAM Definition

A Range Content Addressable Memory (RCAM) combines the memory function with associative processing capabilities. The RCAM stores Range Key Entries that represent ranges of integers and Associated Data Entries that correspond uniquely to these ranges. When a key is submitted, the RCAM searches for a range that may contain the submitted key. If such a range is found, the data associated with this range is retrieved. The associated data is accompanied by a Match signal. If the submitted key is not found in the set of stored ranges, a No-Match signal is issued.

Range Definition

A Range R is defined as a set of all the integers K that comply with the condition $N_L \leq K < N_H$, where $N_L$ and $N_H$ are two integers such that $0 \leq N_L < N_H$. This condition is denoted by $[N_L, N_H)$. Then, $$R = [N_L, N_H)$$

and for any integer K defined above:

$$K \in R \rightarrow N_L \leq K < N_H$$

$N_L$ and $N_H$ are defined as the Range Lower and Upper Boundaries, respectively.

Note: Zero can only appear as $N_L$ in a range.

FIG. 1 demonstrates graphically the meaning of a range.

The above Range definition implies that the Range Lower Boundary $N_L$ belongs to the Range; that is, $$N_L \in R,$$

whereas the Range High Boundary $N_H$ does not belong to the Range, or, $$N_H \notin R$$

The Range Lower Boundary is a Closed Boundary in mathematical terms, whereas the Range Upper Boundary is an Open Boundary. Thus, the Range as defined here is a Semi-Closed/Semi-Open interval of integers.

The Range R as defined above provides a very efficient representation for address ranges in Classless Inter Domain Routing (CIDR) used in Internet Protocol Version 4 (IPv4), the currently used IP version.

An IPv4 CIDR Address (actually an address range) consists of 32 bits. These 32-bit values are typically represented as four decimal values separated by a full stop, each representing an 8-bit binary number (see Karanjit S. Siyan, "Inside TCP/IP: A Comprehensive Introduction to Protocols and Concepts", New Riders Publishing, 1997; Howard C. Berkowitz, "Designing Addressing Architectures", Macmillan Technical Publishing, 1999).

The IPv4 CIDR address range is represented as:

$$A/p$$

where A is the IPv4 address, and p is the prefix, i.e., the number of contiguously compared most significant bits from left to right, $0 \leq p \leq 32$. The prefix is equivalent to a 32-bit mask consisting of p "1"s followed by 32-p "0"s. A "0" indicates that the address bit must be ignored when comparing the value of a CIDR address with an address.

The IPv4 CIDR address range can be represented as a range using the following formula:

$$A/p = [A, A+2^{32-p})$$

Comparing this formula with the range definition given above, $R = [N_L, N_H)$, it is clear that the IPv4 CIDR address range parameters A and p are related to the range lower (closed) boundary $N_L$ and upper (open) boundary $N_H$ by simple formulas:

$$N_L = A$$

$$N_H = A + 2^{32-p}$$

$$p = 32 - \log_2(N_H - N_L)$$

The IPv4 CIDR addresses can always be represented by ranges, but not all the ranges can have equivalent CIDR addresses. However, the CIDR addresses can be aggregated to form any range.

A Range R may be defined in a similar way as above, as a set of all the integers K that comply with the condition $N_L < K \leq N_H$, where $N_L$ and $N_H$ are, as before, the Lower and Upper Boundaries, respectively, of the Range, such that $0 \leq N_L < N_H$. This condition is denoted by $(N_L, N_H]$. Then, $R = (N_L, N_H]$. In this case, R is a Semi-Open/Semi-Closed interval of integers. This range representation has the same advantages as the first one described above.

Alternative range representations, with open lower and upper boundaries, or closed lower and upper boundaries, are less useful.

Definitions, basic properties and operations of ranges, RCAM implementations, and applications of the RCAM for Classless Inter Domain Routing (CIDR) are provided in my co-pending, unpublished PCT Patent Application Ser. No. IL01/00595.

RAM-Based RCAM

Principles of Operation

One important aspect of the RAM-Based RCAMs of the present invention is keeping the key list in an orderly fashion. This means that the key entries are stored in such a way that:

The key entries are located in monotonic order (i.e., in a subsequent ascending or descending order) in a multi-dimensional memory array.

The empty locations in the memory array are contiguous, and may either follow or precede the occupied locations, with a uniquely defined transition point between the last occupied location and the first empty location, or vice versa.

The block of occupied locations may either start at the first memory address or end in the last memory array address.

The location of key entries in monotonic order can be implemented in various ways:

The key entries can be arranged in rows or columns, and in each of these cases, in ascending or descending order.

If arranged in rows, each row can start at the first or last column. The key entries of each row can be arranged from left to right, or right to left, or in alternating directions between contiguous rows.

If the array is transposed by interchanging rows and columns, and the key entries are arranged in columns, each column can start at the first or last row. The key entries of each column can be arranged downwards, upwards, or in alternating directions between contiguous columns.

In either case, at least a portion of the array is filled with valid key entries without blanks and the associated data entries are arranged in correspondence with the key entries. The key and associated data entries are stored in the array prior to the submission of a key for search.

Although the RAM-based RCAM may be implemented using any of the alternatives mentioned above, the following cases are elaborated herein, by way of example:

The key entries are stored in contiguous ascending order in Two-Dimensional Arrays (TDAs).

The list of key entries starts at the lowest memory array address.

The empty locations block follows the key list.

Figure 2:
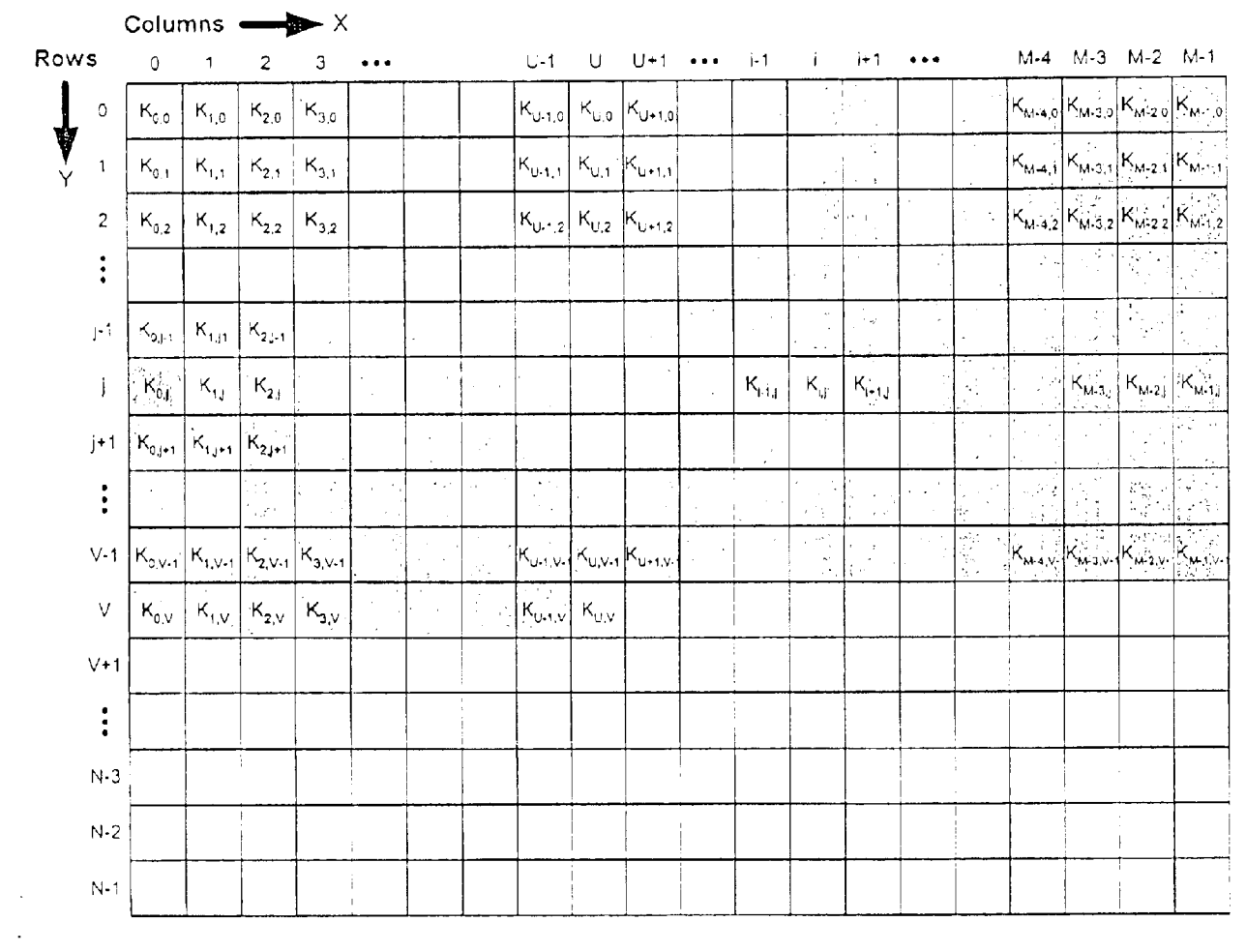

FIG. 2 depicts a TDA of M columns by N rows. The rows are sequenced from top to bottom and indexed with an integer index j, where $0 \leq j \leq N-1$. The columns are sequenced from left to right and indexed with an integer index i, where $0 \leq i \leq M-1$. The occupied key entry locations are shadowed with light gray. The empty locations are blank. A key located in column i and row j has an integer value $K_{ij}$. The lowest key value $K_{0,0}$ resides in row 0 and column 0. The highest key value $K_{U,V}$ resides in row V and column U. Thus, $K_{p,r} > K_{q,r} \Rightarrow p > q$, and $K_{p,r} > K_{p,s} \Rightarrow r > s$ The TDA parameters are:

b: Key data width

M: Number of TDA columns, or number of b-bit wide key words in a TDA row

N: Number of TDA rows

U: Last key entry column

Figure 3:
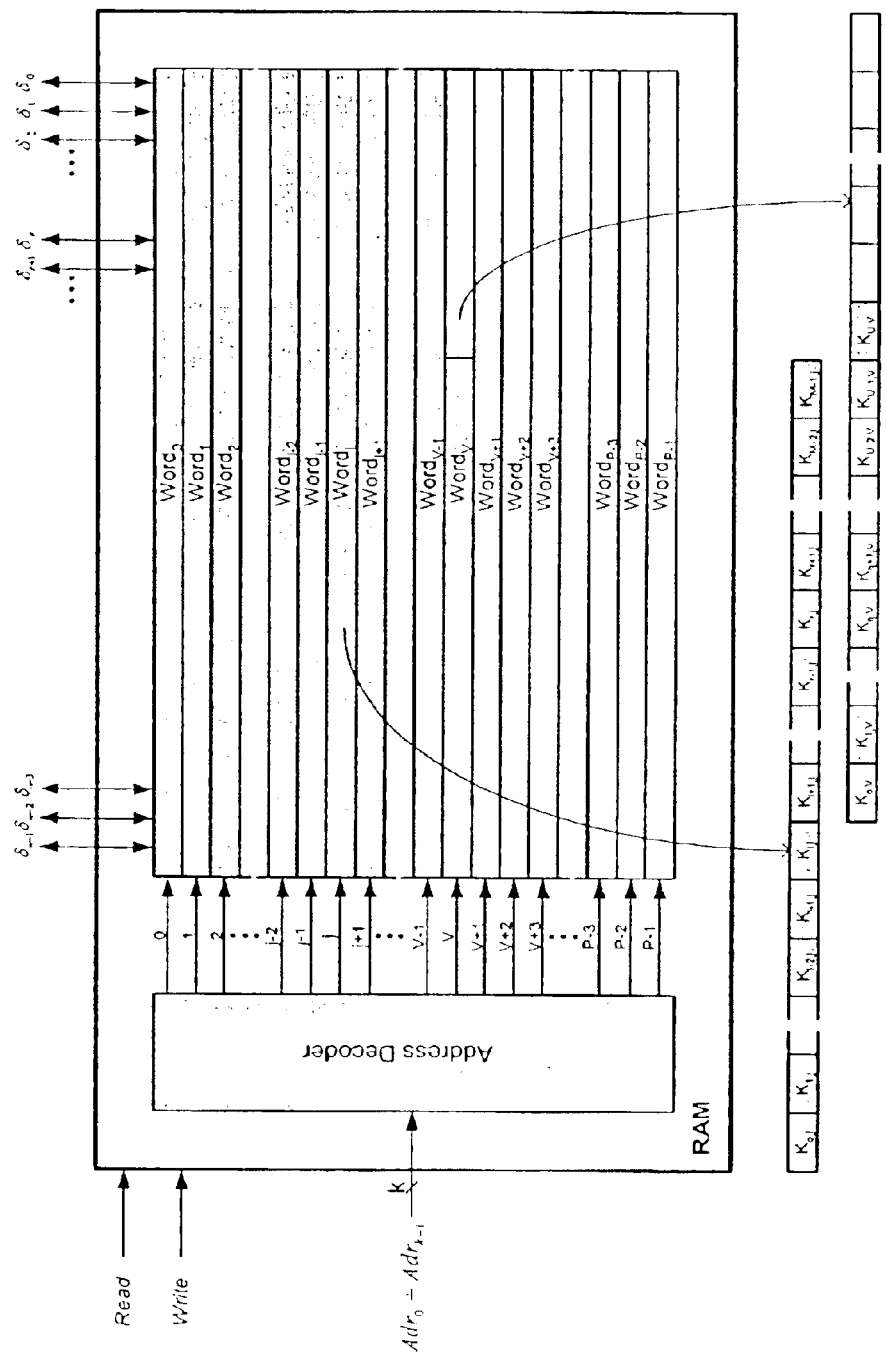
FIG. 3 is a schematic illustration of the mapping of keys in a conventional RAM.

V: Last key entry row j: Key row index, $0 \leq j \leq V$ i: Key column index, $0 \leq i \leq M-1$ for $j < V$ and $0 \leq i \leq V$ for $j = V$ The RAM organization is depicted in FIG. 3.

The RAM parameters are:

W: Width of the RAM word and of the RAM data bus $\delta_0 - \delta_{w-1}$: RAM word bus, where $\delta_0$ is defined as the word rightmost bit, and $\delta_{w-1}$ is the word leftmost bit.

P: Number of w-bit wide words in the RAM $Adr_0 - Adr_{k-1}$: k-bit wide RAM address bus.

Each w-bit wide RAM word contains M key words:

$$w = M \cdot b$$

The width k of the RAM address bus is:

$$k = \text{Ceil}\{\log_2 P\},$$

where $\text{Ceil}\{x\}$ is the ceiling or the next larger integer for a real non-integer number x (and is equal to x if x is an integer).

The RAM location of any key entry Ki,j in row j of the TDA is determined as follows:

Define $$(Adr_{k-1}, Adr_{k-2}, \ldots, Adr_2, Adr_1, Adr_0)_2$$

as the binary representation of the address in the RAM Address Bus, and $$(\kappa_{b-1}, c_{-2}, \kappa_{b-3}, \ldots, \kappa_2, \kappa_1, \kappa_0)_2,$$

as the binary representation of the key entry $K_{i,j}$ located in row j of the TDA. The bit $\kappa_s$ in the key binary representation is equal to the bit $\delta_t$ in the RAM word:

$$\kappa_s = \delta_t,$$

$$t = w - (i+1) \cdot b + s,$$

where s and t are integers such that:

$$0 \leq s \leq b-1, \; 0 \leq t \leq w-1$$

This mapping leads to the following conclusions:

A conventional RAM can be applied to implement a TDA.

The constraints on the RAM bus width are determined by the formula $w = M \cdot b$ A single RAM word may incorporate M keys, all accessible with a single RAM read or write operation.

The RCAM key ranges must be non-overlapping for RAM-based operation. This requires the prior conversion of the IPv4 CIDR overlapping range set into a equivalent non-overlapping range set according with the principles presented in my co-pending, PCT Application Ser. No. IL01/00595.

If the non-overlapping ranges are not adjacent, they can be made adjacent by "interpolating" intervals between them. These intervals are not proper ranges, because they have open lower boundary and closed upper boundary, unlike a proper range that has a closed lower boundary and an open upper boundary.

Adjacent ranges yield a compact representation, in which each shared boundary appears once instead of twice in the "conventional" adjacent range notation, i.e., only the lower boundary of each range is presented, instead of both the lower and upper boundaries of each range.

The RCAM sequentially stores the lower boundaries of the adjacent ranges in contiguous ascending order. The upper boundary of the last range is also included at the end. This compact adjacent range representation in an array is suitable for implementing a RAM-Based RCAM. As used herein in the specification and in the claims section that follows, the terms "Range Key Entries", "Range Boundary Values" and the like refer to the entries of this array. These terms are specific examples of what is defined more generally as "Range Boundary Information". Preferably, the range can be represented within the array as a single range-boundary value.

The Associated Data entries corresponding to the ranges are stored in the same order in the Associated Data array. The data associated with the intervals that are not valid ranges have no meaning (Don't Care).

As used herein in the specification and in the claims section that follows, the terms "Range Validity Information" and the like refer to data that indicate the validity of a range. A specific kind of Range Validity Information is termed "boundary status", yet a more specific kind of Range Validity Information is termed "boundary type", "associated boundary type", "associated boundary type entry", and the like. Preferably, the boundary type entry provides an indication of whether a range boundary is closed or open.

As used herein in the specification and in the claims section that follows, the term "row" refers to a first line of cells in an array, and the term "column" refers to a second line of cells in an array, the second line of cells being disposed in perpendicular fashion to the first line of cells. For the sake of convenience, all rows are horizontal in the Figures provided herein, and all the columns are vertical.

As used herein in the specification and in the claims section that follows, the term "monotonic order" and the like refer to one or more rows (or one or more columns) in an array in which the range boundary values are in ascending order or in descending order. This can be achieved in various ways, as demonstrated hereinabove. The term "monotonic order" specifically includes rows having a cyclic monotonic order, e.g., 9,15,69,81,2,4,7, or 23,105,222,611,8,14.

The correspondence between the Range Key array, the Associated Data array and the Associated Boundary Type array is shown in FIG. 4. The associated data are arranged in a 2-dimensional memory array of M columns by N rows that contains associated data entries $D_{i,j}$ corresponding uniquely to the range key entries $K_{i,j}$ in the key list. This arrangement allows a straightforward access to $D_{i,j}$ and $M_{i,j}$ once $K_{i,j}$ is searched and located.

Figure 4A:
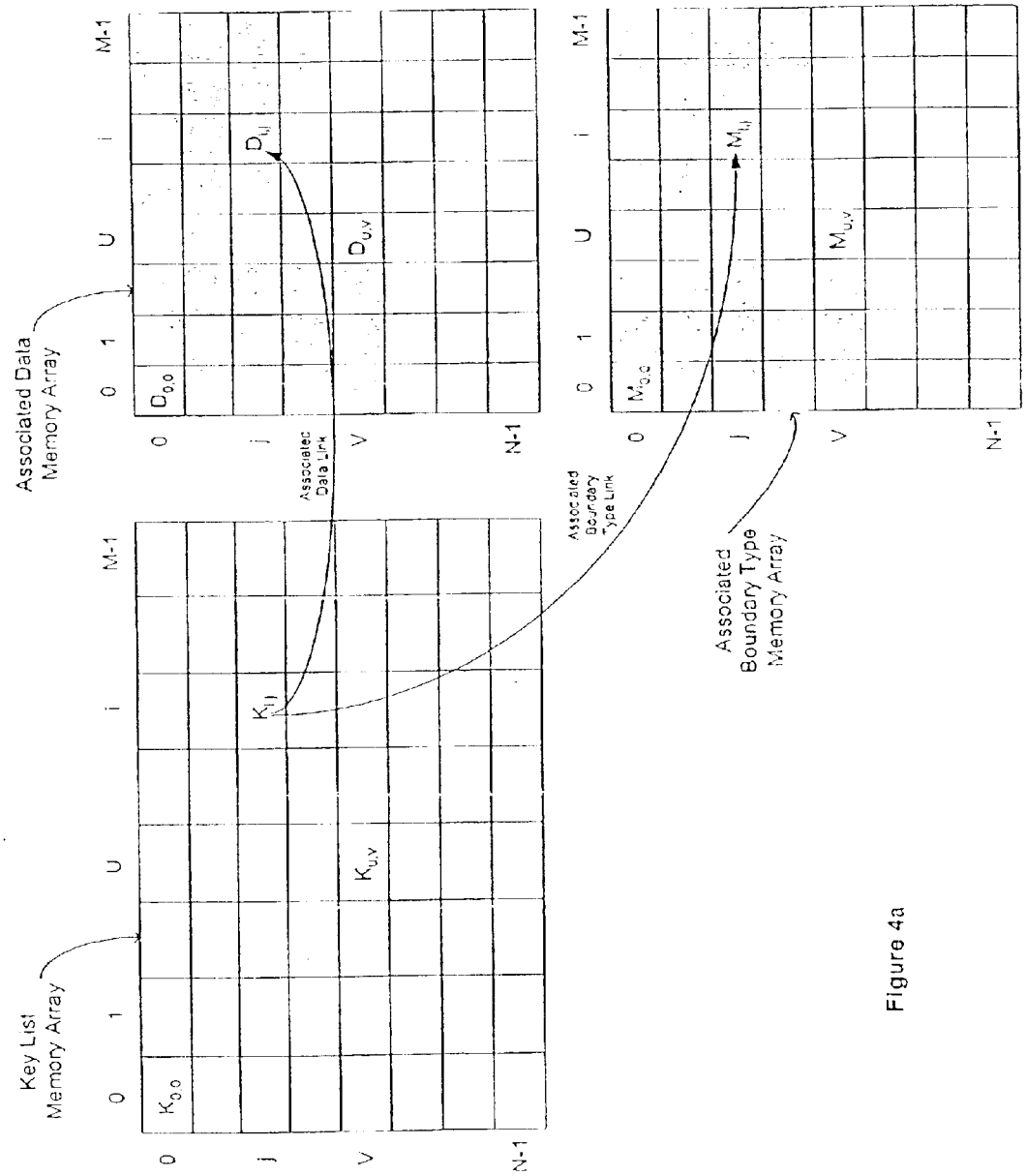
FIG. 4 is a schematic illustration of the correspondence between the 2-dimensional Key Array, Associated Data Array and Associated Boundary Type Array.
Figure 4B:
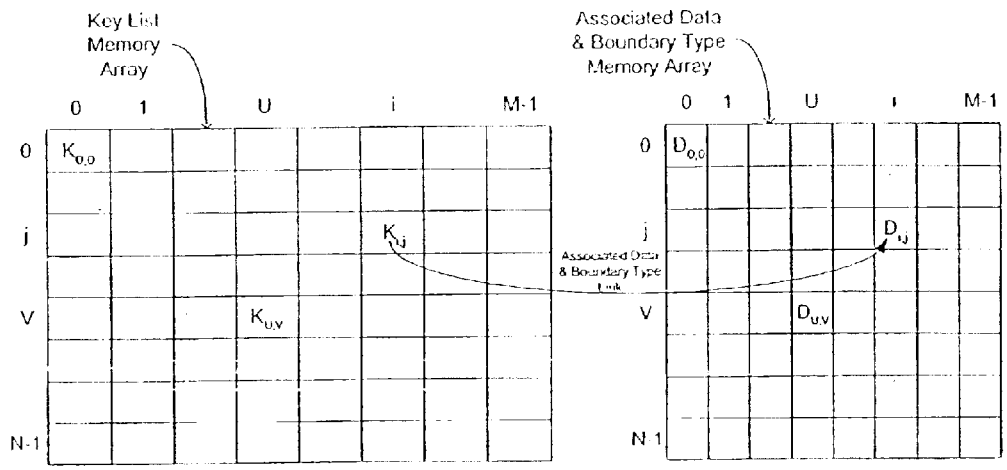
Figure 4C:
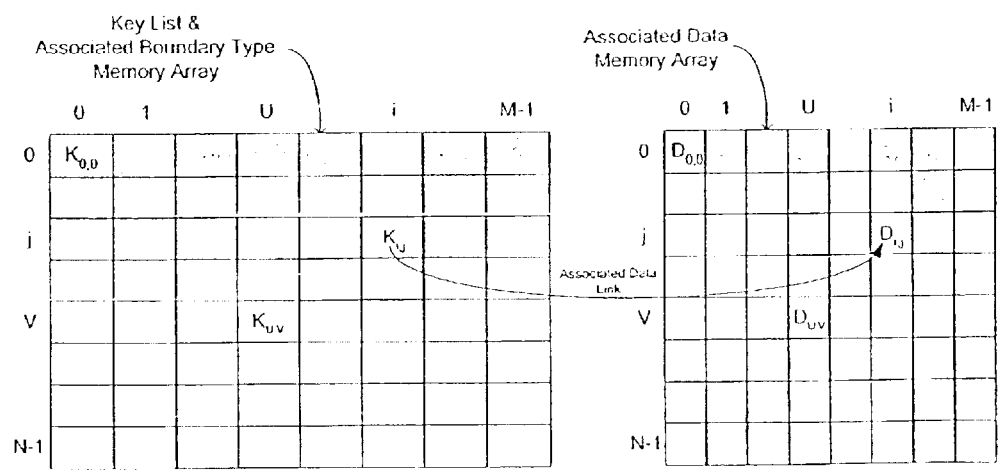

In one preferred embodiment of the present invention, the Range Key entries, Associated Data entries and Associated Boundary Type entries are located in three separate Two-Dimensional Arrays (TDAs), as shown in FIG. 4a. In another preferred embodiment of the present invention, the Associated Data entries and the Associated Boundary Type entries are combined in the same TDA, as shown in FIG. 4b. In a third preferred embodiment of the present invention, the Associated Boundary Type entries are incorporated with the Range List entries, as in FIG. 4c. If the Associated Boundary Type entry indicates that the range is valid (i.e., that the boundary is closed), the corresponding Associated Data entry is accessed.

Since each TDA is addressed by its row and column indexes, it can be implemented with any type of RAM, such as a static RAM (SRAM), a dynamic RAM (DRAM), or any other memory technology.

Key Search in a TDA Range Key List
Two-Step Search Algorithm

Figure 5:
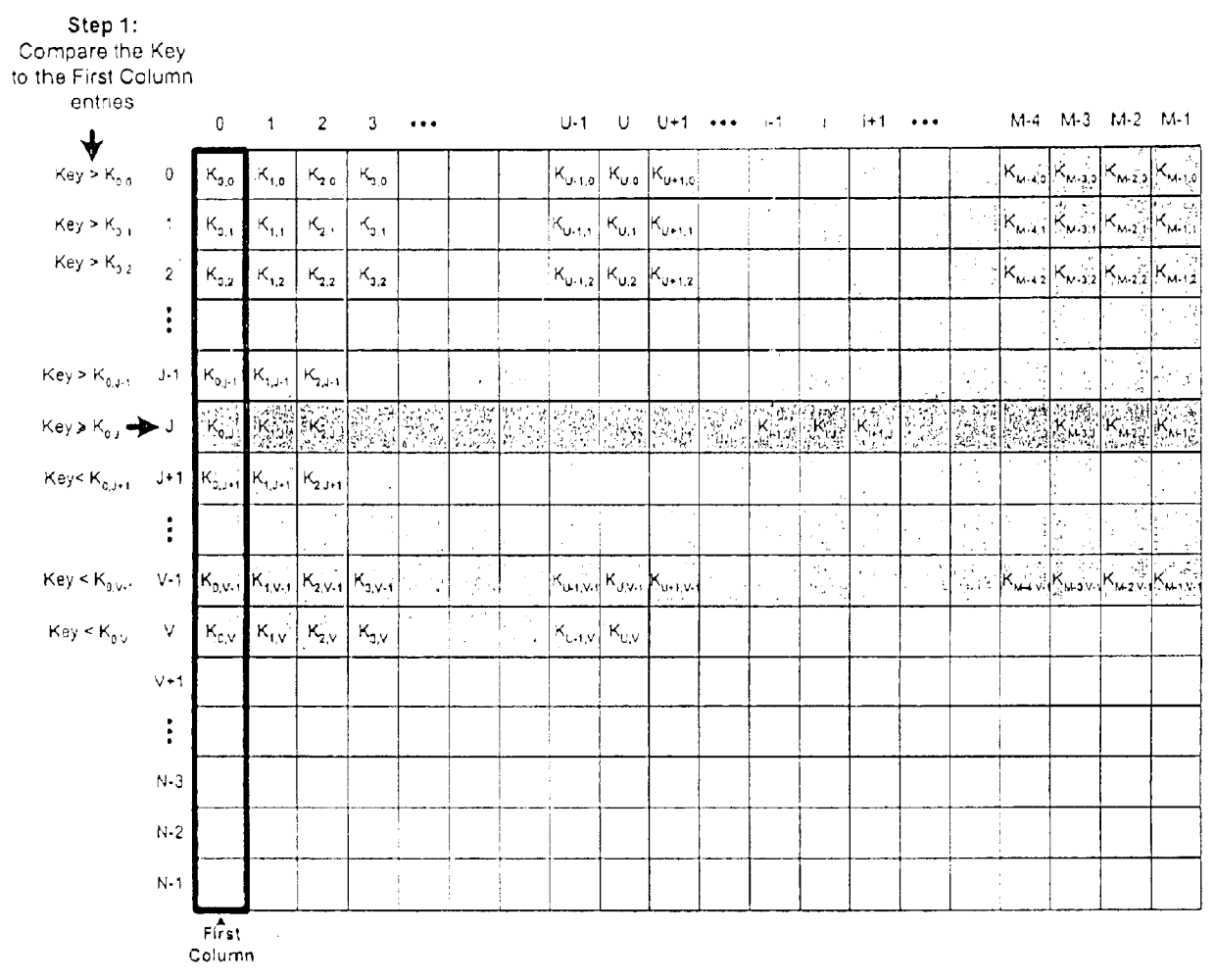
Figure 6:
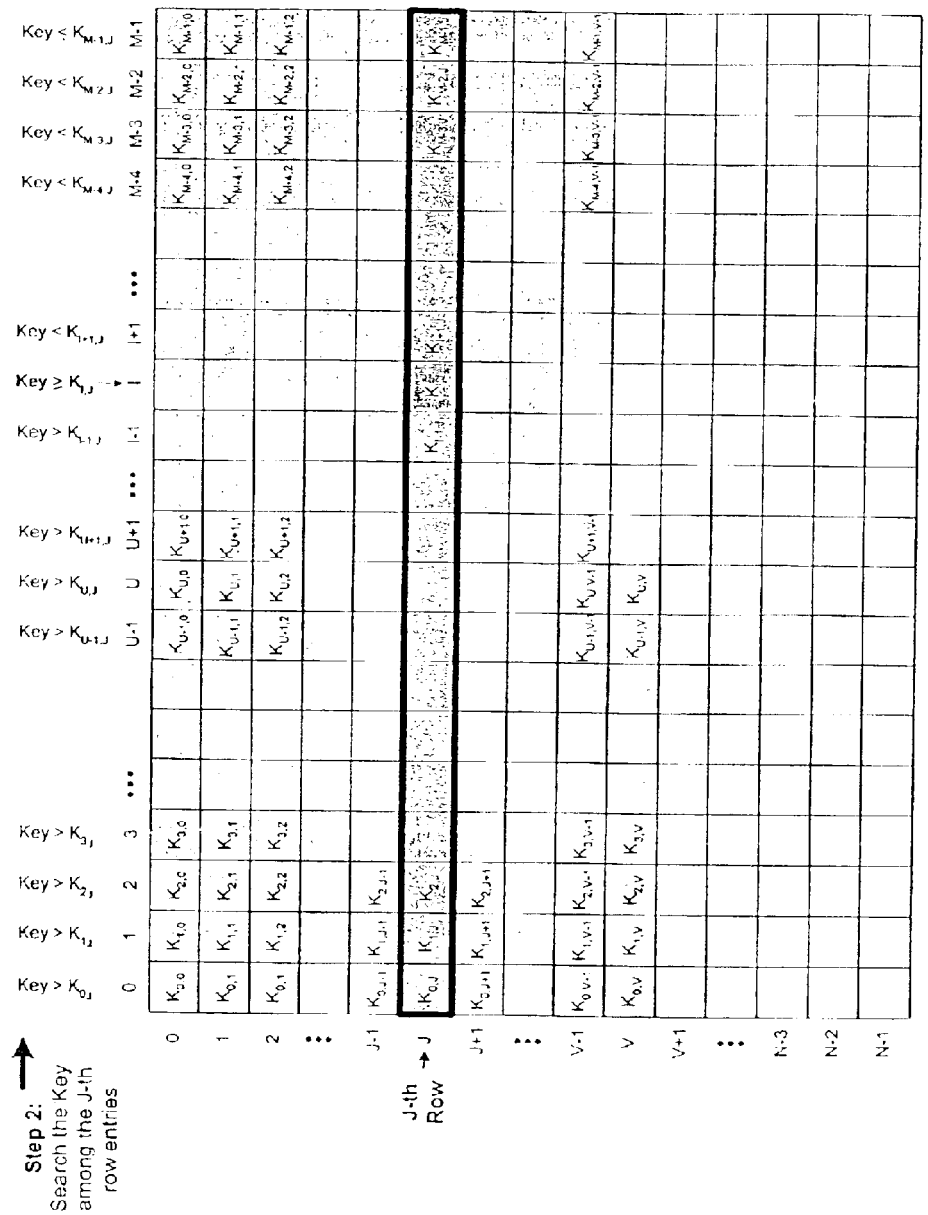
FIG. 6 is a schematic illustration of Step 2 in a Sequential Key Search in a TDA—Column Location.

FIG. 5 and FIG. 6 illustrate a sequential search of the submitted key (Key Search) in the TDA. This search can be completed in two steps:

Step 1 (FIG. 5): Identification of the TDA row where the key entry is located.

Step 2 (FIG. 6): Access to the row identified in Step 1 and look-up of the key entry.

Prior to Key Search in the Range Key List, the submitted key is compared with the Range Key List values in the first and last locations. If Key<$K_{0,0}$, or Key>$K_{U,V}$, then the search is over because the key is not included in the Key List. If $K_{0,0} \leq$ Key $\leq K_{U,V}$, then the key is potentially listed in the Range Key List. In this case, the search procedure can start with Step 1.

Step 1: The TDA row which may contain the key is identified by searching through the first column keys. The range key list entries, including those in the first column, appear in an ascending order:

$$K_{0,0}<K_{0,1}<K_{0,2}< \ldots <K_{0,j-1}<K_{0,j}<K_{0,j+1}< \ldots <K_{0,V-1}<K_{0,V}$$

If the key is listed in the range key list, it must be located between two keys in the first column, one smaller or equal and the other larger than the searched key; that is:

$K_{0,J} \leq$ Key$<K_{0,J+1}$ for J<V or $K_{0,J} \leq$ Key $\leq K_{U,V}$ for J=V This function used to locate the row that potentially contains the key is relatively simple. FIG. 5 shows that the key is larger than all the first column keys located above the target row, equal or larger than the first column key in the target row, and smaller than all the first column keys below the target row.

Step 2: This step is performed to locate the column that contains the key and is shown in FIG. 6.

The entire J-th row is read out and all the range keys listed in the row are compared with the searched key. If $K_{1,J} \leq K < K_{1+I,J}$, then:

$K \geq K_{i,J}$ for $i \leq I$ $K < K_{i,J}$ for $I<i \leq M-1$ if J<V and for $I<i \leq U$ if J=V If key $K_{I,J}$ is smaller than or equals the submitted key, and the next key $K_{I+1,J}$ is larger than the submitted key, then $K_{I,J}$ listed in row J and column I matches the searched key range defined by $K_{I,J} \leq K < K_{I+1,J}$. If the submitted key is larger than all the row entries in the Key TDA, then the last valid key entry in the row is defined as the matching key. The index pair (I,J) of the matching key is used to access the associated data entry $D_{I,J}$ corresponding to $K_{I,J}$ (and to the matching range) located in the Associated Data Memory TDA. The Index pair (I,J) is also used to access the associated boundary type entry $M_{I,J}$ located in the Associated Boundary Type TDA. $M_{I,J}$ is a 1-bit number that determines the validity of the range:

$M_{I,J}$="1" corresponds to a Closed Boundary and designates a valid range, and $M_{I,J}$="0" corresponds to an Open Boundary and indicates that the range is not valid.

Following the valid range key entries, the unoccupied entries are loaded with $(0,0, \ldots, 0)_2$. Since "0" is not a valid entry, except for, a k-bit $(0,0, \ldots, 0)_2$ value can be used to indicate an empty location by a k+1 bit $(1,0,0, \ldots, 0)_2$ for any location except the first range entry.

Since the k+1 bit value $(1,0,0, \ldots, 0)_2 = 2^k > K$ for any k-bit K value, then $(1,0,0, \ldots, 0)_2$ is larger than any submitted key K.

Figure 7:
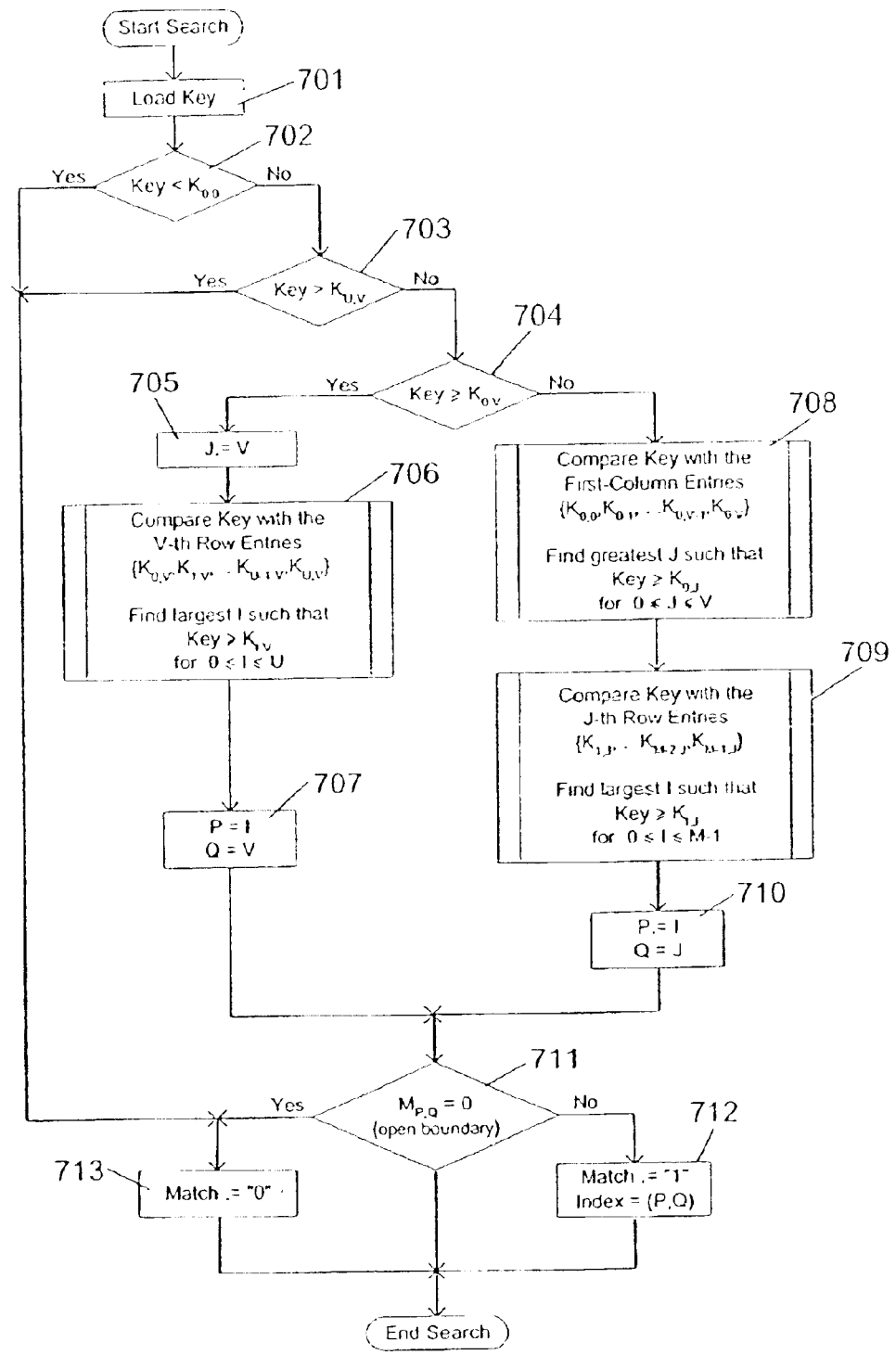
FIG. 7 shows a flowchart for the Two-Step Key Search in a TDA.

FIG. 7 shows a flowchart that presents the Two-Step Search in an algorithmic form.

In the first step, the searched key is loaded (701). Then, the searched key is compared with the lowest key, $K_{0,0}$ (702). If Key<$K_{0,0}$, the search is terminated with no match. If Key≧$K_{0,0}$, the searched key is compared with the largest key $K_{U,V}$ (703). If Key>$K_{U,V}$, the search is terminated with no match (713). If Key≦$K_{U,V}$, the searched key is compared with the largest key in the first column, $K_{0,V}$ (704). If Key≧$K_{0,V}$, the target row is identified as row V (705). Then, the searched key is compared with each entry enlisted in row V (706). The index (I,V) of the row entry with the largest I that meets the condition Key≧$K_{I,V}$ for 0≦I≦U designates the matching key (707).

If Key<$K_{0,V}$ in step 704, the searched key is compared with the entries of the first column to find the row with the largest index J that meets the condition Key≧$K_{0,J}$ for 0≦J≦V (708). Then, the searched key is compared with each entry enlisted in row J (709). The index (I,J) of the row entry with the largest I that meets the condition Key≧$K_{I,J}$ for 0≦I≦M−1 designates the matching key (710).

Finally, the index of the matching key designated in step 707 or 710, say (P,Q), is used to access the associated boundary type entry $M_{P,Q}$ corresponding to $K_{P,Q}$ (and to the matching range), in order to determine the validity of the range (711). If $M_{P,Q}$="1" (712), it corresponds to a closed boundary and designates a valid range; if $M_{P,Q}$="0" (713), it corresponds to an open boundary and indicates that the range is not valid.

Pipelined Search Algorithm

The search algorithm presented previous section executes the search in two steps. Thus, the next search can start only after the completion of Step 2 of the current search.

A conventional, high-density/high-performance RAM such as a SRAM or a DRAM requires a RAM-column pre-charge before each readout. Therefore, in most practical cases, the RAM is clocked with a clock signal of period T. Thus, the two-step algorithm requires two clocks for execution. If the clock frequency is $f_c$ and the search throughput is $f_s^{2S}$, then:

$$f_s^{2S} = \frac{f_c}{2} = \frac{1}{2 \cdot T}$$

It is thus evident that the two-step algorithm described above performs the search operations at half the RAM clock rate.

A simple modification enables to perform search operations at full clock rate in a pipelined fashion. By performing step 1 on a new key in the first column while simultaneously fetching a RAM word and performing step 2 on the current key, the search operations are pipelined and the final location of key number m takes place concurrently with the start of the search for key number m+1 in the following fashion:

Step 2 is performed on key number m

Step 1 is performed on key number m+1

It will be demonstrated hereinbelow, on a hardware implementation, that the simultaneous access to the leftmost column and to the RAM word is necessary, in any event, if the column is to be compared in a single step.

Figure 8:
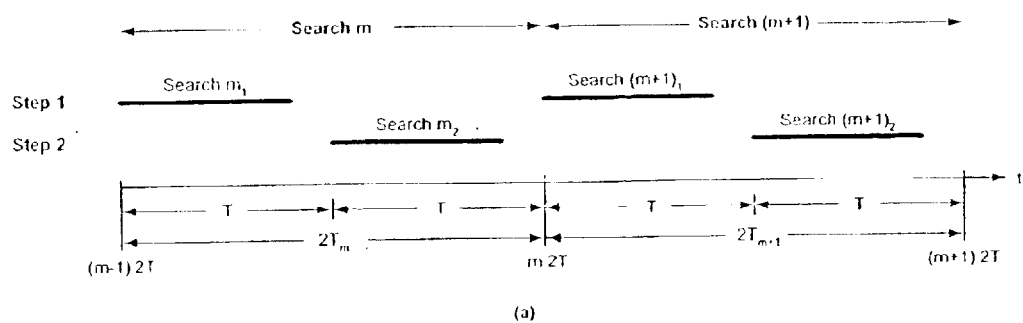
FIG. 8 shows timing diagrams for (a) a Sequential Two-Step Key Search, and (b) a Sequential Pipelined Search.
Figure 8:
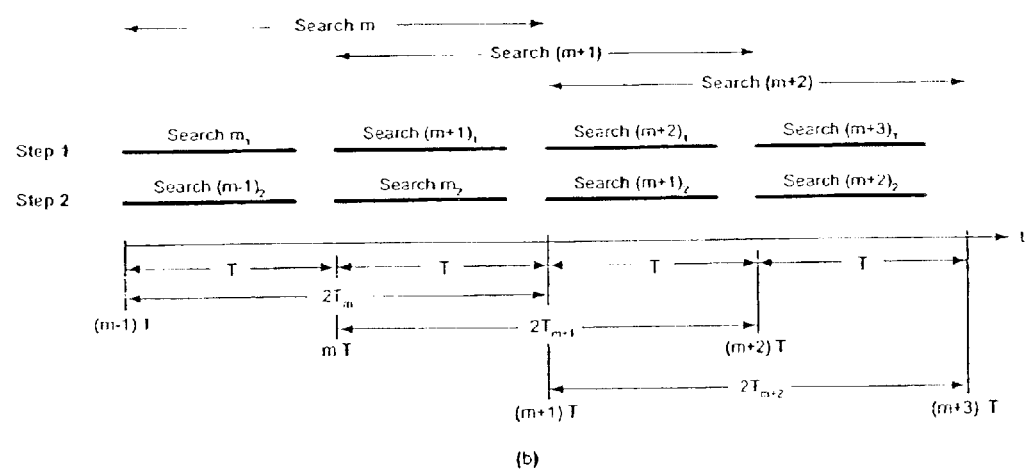

The timing diagrams in FIG. 8 illustrate the difference between the two-step serial and pipelined search algorithms for the Binary CAM or RCAM. In both modes, it is assumed that:

Each step of the two-step search cycle requires one RAM clock period for execution, denoted by T. Thus, each search cycle lasts 2T.

The Search operation starts with a search cycle for submitted Key 1, denoted as Search 1, which starts with a at t=0. Thus, step 1 of Search 1 (RAM row identification) is completed at t=T and step 2 (key entry location in the identified row) at t=2T.

Search $m_1$ and Search $m_2$ represent steps 1 and 2, respectively, of a generic Search m for submitted Key m.

In the two-step search algorithm, a new search cycle starts only after the search cycle for the previous key is completed; thus, it requires two clocks for execution and it is performed at half of the clock rate. In this mode, since Step 1 (for Key 1) starts at t=0 and ends at t=2T, Search 2 (for Key 2) starts at t=2T and ends at t=4T; a generic Search m (for Key m) starts at t=(m−1)·2T and ends at t=m·2T. FIG. 8(a) shows the corresponding timing diagram.

In the pipelined search algorithm, a new search cycle starts after the first step of the previous search cycle is completed, i.e., just a clock period T after the start of the previous cycle; thus, it enables to perform search operations at full clock rate. In this mode, Search 2 (for Key 2) starts at t=T and ends at t=3T. A generic Search m (for Key m) starts at t=(m−1)·T and ends at t=(m+1)·2T. Step 1 of Search m takes place simultaneously with step 2 of the preceding Search m−1, whereas Step 2 of Search m proceeds simultaneously with step 1 of the succeeding Search m+1. FIG. 8(b) shows the corresponding timing diagram.

It is clear from 8(b) that the search operation throughput $f_s^P$ is performed at a full RAM clock rate:

$$f_s^P = f_c = \frac{1}{T}$$

However, a price is paid for the improved performance: the two-step search algorithm can use only a single compare function. This compare function has $C^{2S}$ stages, $$C^{2S} = \text{Max}(M,N)$$

where:

M is the number of columns in the TDA.

N is the number of rows in the TDA.

Max (a,b) is the function which selects the maximum value between two arguments, a and b.

In the case of the Pipelined Algorithm, the compare function has $C^P$ stages, where:

$$C^P = M+N$$

Since (M+N)>Max(M,N), then $C^P$>$C^{2S}$, and the Pipelined Algorithm will require somewhat more hardware, but it will be twice as fast.

First Column Register

The above-described search algorithms described are based on the assumption that the access to the leftmost column elements in the RAM can be performed in one step (or in a single clock). The RAM structure enables the access to a single RAM word (or a single TDA row) in a single clock cycle. On the other hand, the first column keys are located in N different RAM words. The keys in the RAM cannot be simultaneously accessed, as there is only one readout facility capable of reading a one word at a time.

Figure 9:
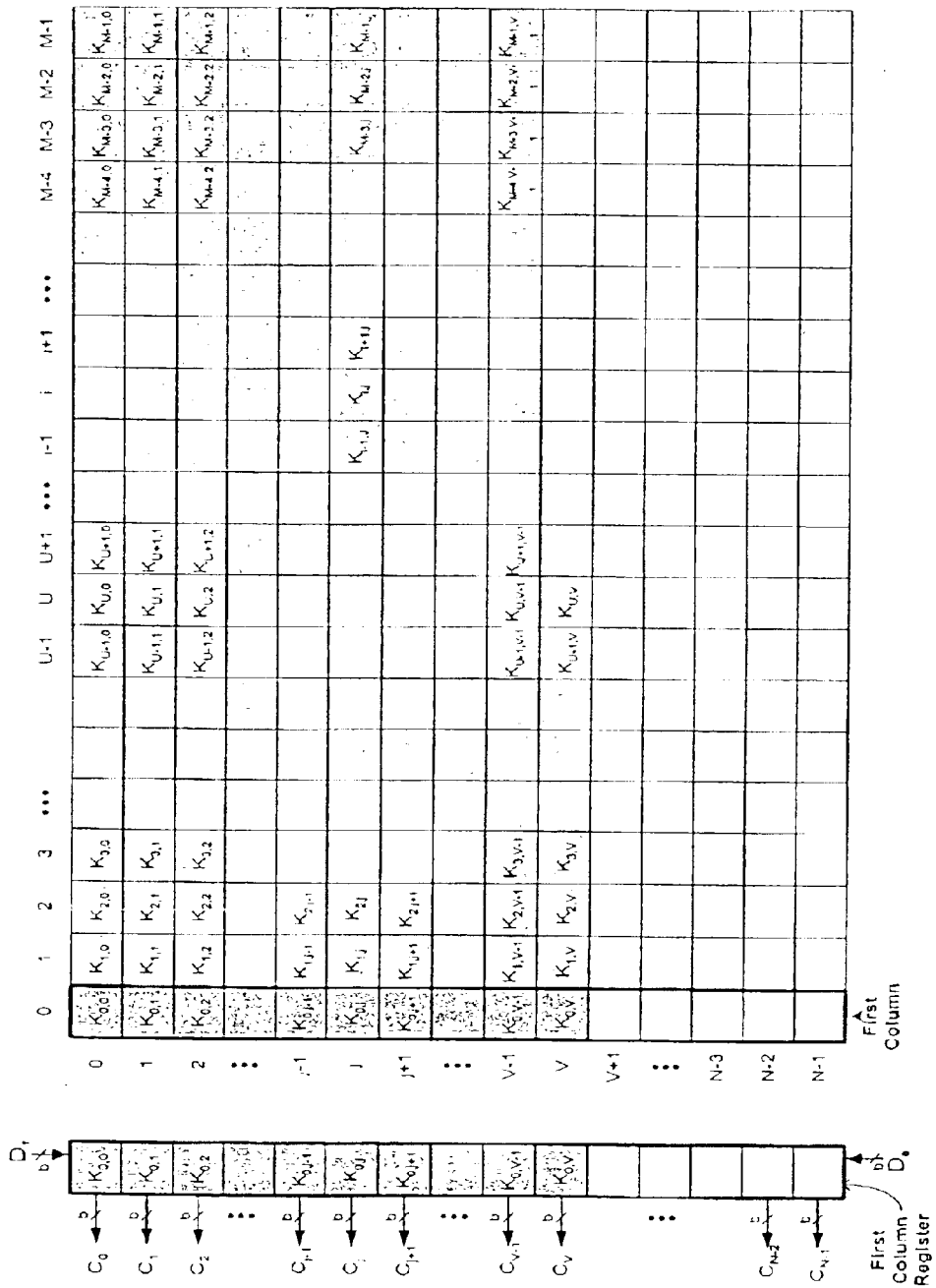
FIG. 9 is a schematic illustration of the First Column Register that enables simultaneous access to the Leftmost Column Keys.

The First Column Register is configured to allow a simultaneous access to the leftmost column keys in the TDA. This register incorporates the leftmost column keys and is kept updated, as shown in FIG. 9.

Thus, the access to the leftmost column in step 1 is performed through the First Column Register rather than in the TDA itself. The parallel readout structure of the First Column Register enables the access to all the first column keys at once.

The loading of the First Column Register keys is performed during Key Insert or Key Remove operations. During an Insert operation, the keys are loaded and serially shifted bottom-up from the $D_B$ input. During a Remove operation, the keys are loaded and serially shifted top-down from the $D_T$ input. Therefore, this register is implemented as a Serial-Input/Parallel-Output structure.

The operation of the First Column Register will be described below, in context with the Insert and Remove operations.

Search Row Locator

Figure 10:
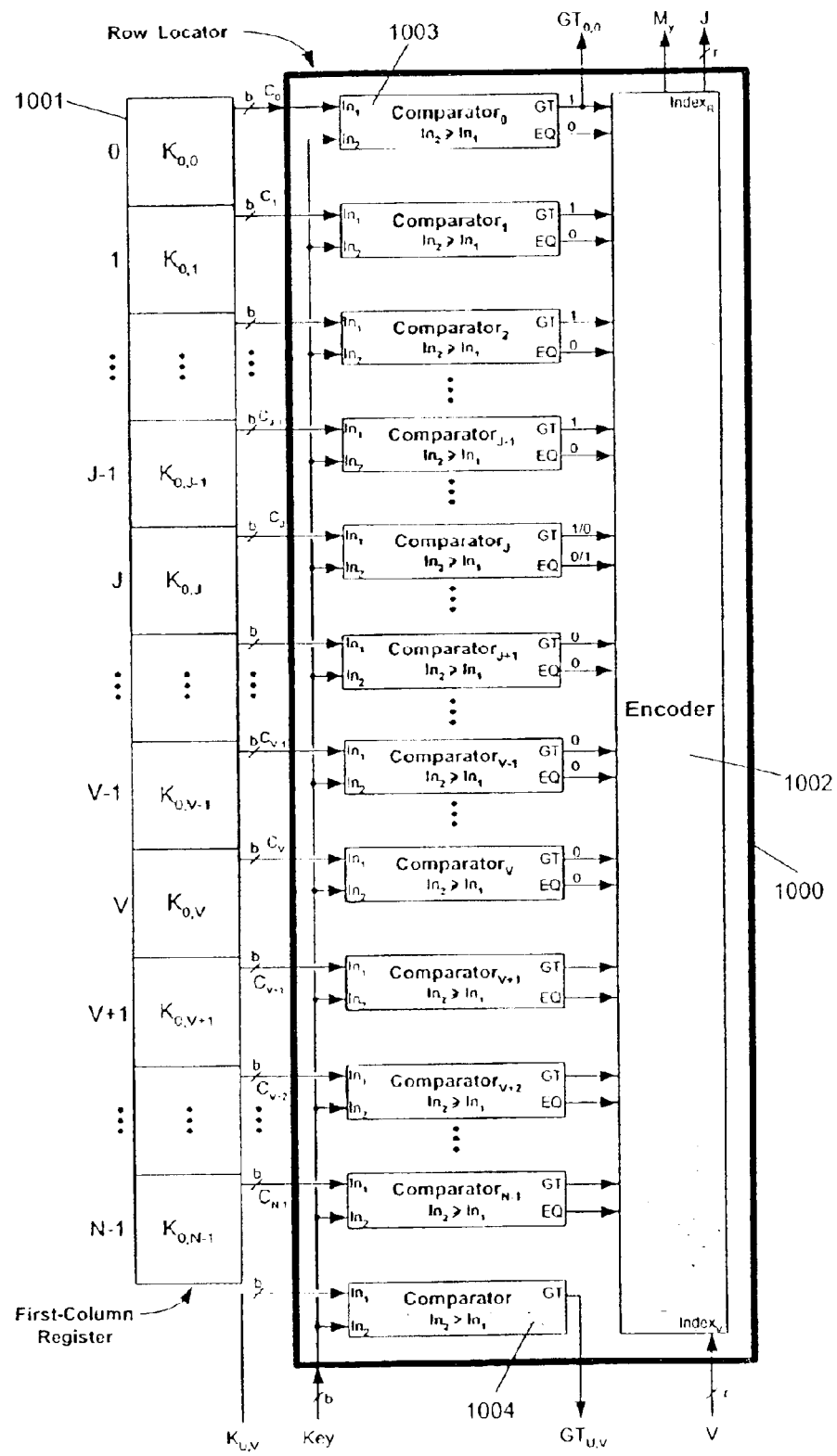
FIG. 10 is a schematic illustration of a possible implementation of the Search Row Locator.

A preferred embodiment for the implementation of the Row Locator is depicted in FIG. 10. The Row Locator (1000) locates the number of the row which may contain the searched key. The Row Locator inputs are:

(1) $C_0, C_1, C_2, \ldots, C_{J-1}, C_J, \ldots, C_{V-1}, C_V, \ldots, C_{N-2}, C_{N-1}$: The b-bit wide words of the First Column Register (1001) that correspond to the TDA First Column keys are: $K_{0,0}, K_{0,1}, K_{0,2}, \ldots, K_{0,J-1}, K_{0,J}, \ldots, K_{0,V-1}, K_{0,V}, \ldots, K_{0,N-2}, K_{0,N-1}$.

(2) Key: A b-bit value whose location is searched.

(3) $K_{U,V}$: The top listed key value.

(4) $Index_V$: An r-bit value that designates the last valid data row. This signal causes the locator to account only for the first column inputs $C_0, C_1, \ldots, C_V$, and ignore all the inputs from $C_{V+1}$ to $C_{N-1}$. The following formula determines the value of r:

$r = \text{Ceil}\{\log_2 N\}$, where $\text{Ceil}\{x\}$ denotes the ceiling of x.

The Row Locator outputs are:

(1) $Index_R$: This r-bit wide bus designates the row number J which may contain the searched key.

(2) $M_y$: When this signal is "1", it indicates that a match has been found, that is, one of the first column keys exactly matches the searched key.

(3) $GT_{0,0}$: This signal indicates that the key value is larger than $K_{0,0}$.

(4) $GT_{U,V}$: This signal indicates that the key value is larger than $K_{U,V}$.

Table 1 lists all the combinations that the Row Locator outputs and the respective interpretations thereof.

TABLE 1

Row Locator Outputs and Interpretations Thereof

| $Index_R$ | My | $GT_{0,0}$ | $GT_{U,V}$ | Interpretation |
|---|---|---|---|---|
| $Index_R = 0$ | "0" | "0" | "0" | The searched key is smaller than $K_{0,0}$ and therefore the key is not listed |
| $0 \leq Index_R \leq V$ | "0" | "1" | "0" | The number J indicated by $Index_R$ designates a valid row to be searched. |
| $0 \leq Index_R \leq V$ | "1" | "1" | "0" | $K_{0,J}$ is the searched key, where J is the row number indicated by $Index_R$ |
| $Index_R = V$ | "0" | "1" | "1" | The searched key is larger than $K_{U,V}$, and therefore the key is not listed. |

The Row Locator consists of a set of comparators, each of which compares the key with one of the entries in the first column (for $j \leq V$), and an Encoder.

Each comparator issues two signals:

GT (greater than): This signal is "1" when $In_2 > In_1$, otherwise it is "0".

EQ (equals): This signal is "1" when $In_2 = In_1$, otherwise it is "0".

The main function of the Encoder is to issue $Index_R = J$, where J is determined by the following formulas:

$K_{0,J} \leq \text{Key} < K_{0,J+1}$ for $J < V$, or $K_{0,J} \leq \text{Key} \leq K_{U,V}$ for $J = V$ The Encoder uses the input V value in $Index_V$ to account only for the comparator outputs connected to $C_0, C_1, \ldots, C_V$, and ignore those connected to $C_{V+1}$ and above.

If Key=$K_{0,J}$, then the EQ output of Comparator J detects an exact match ("1") and the Encoder issues $M_y$="1". If Key>$K_{0,J}$, then $M_y$="0" is issued and row J is detected by the GT output of Comparator J. In either case $Index_R$ designates the row J.

Comparator 0 (1003) issues $GT_{0,0}$, and compares the key with $K_{0,0}$. If Key<$K_{0,0}$, then the $GT_{0,0}$ signal is "0" and the key is not listed; otherwise $GT_{0,0}$ is "1".

A separate comparator (1004) issues $GT_{U,V}$. It compares the key with $K_{U,V}$. If Key>$K_{U,V}$ then the $GT_{U,V}$ signal is "1" and the key is not listed; otherwise $GT_{U,V}$ is "0".

Search Column Locator

Figure 11:
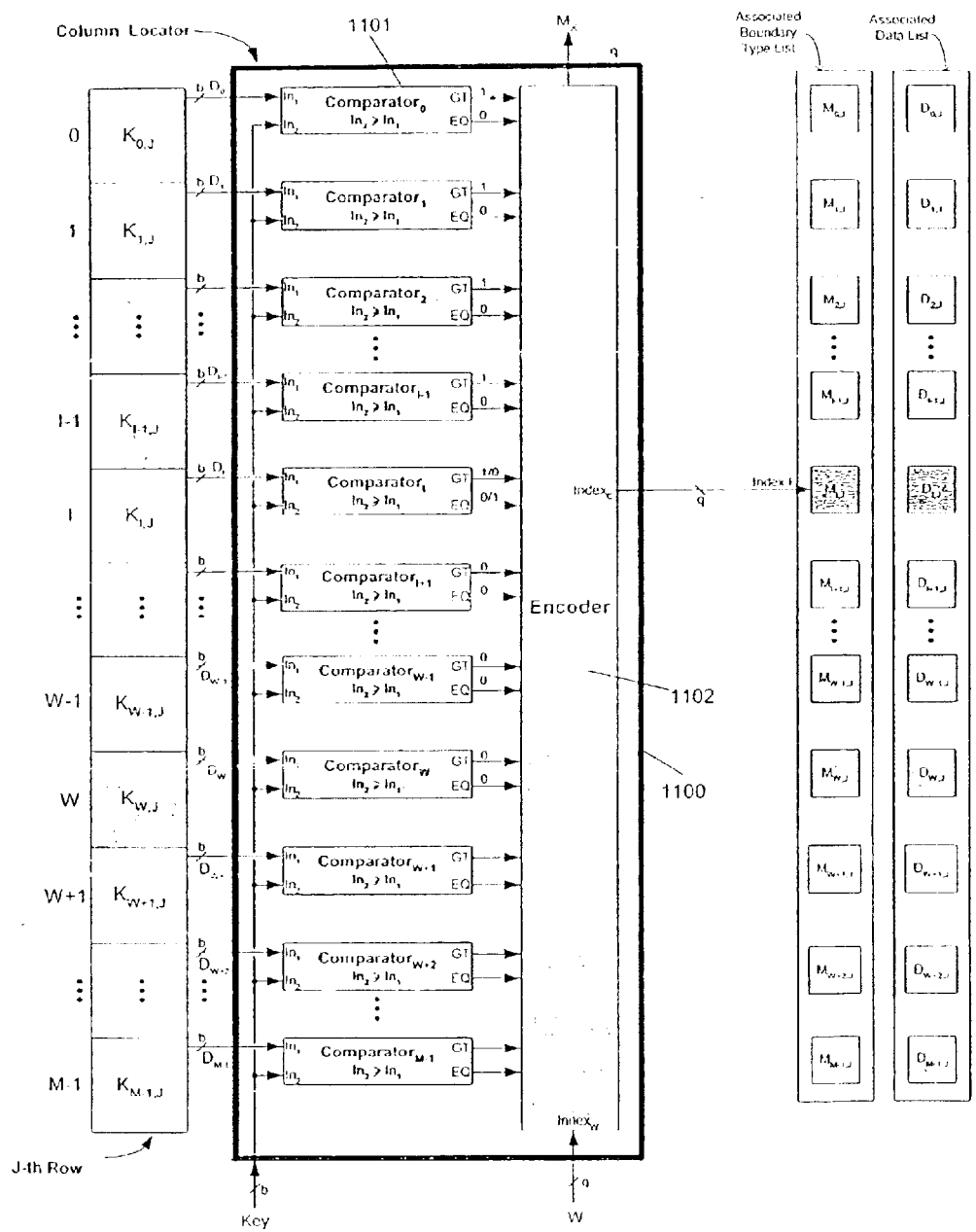
FIG. 11 is a schematic illustration of a possible implementation of a Search Column Locator.

A preferred embodiment for the implementation of the Column Locator is depicted in FIG. 11. The Column Locator (1100) locates the searched key within the row previously identified by the Row Locator.

The Column Locator inputs are:

(1) $D_0, D_1, D_2, \ldots, D_{I-1}, D_I, D_{I+1}, D_{w-1}, \ldots D_{M-2}, D_{M-1}$: M b-bit wide words fetched from the RAM word J related to the stored keys in row J according to the following formulas:

$D_t = K_{t,J}$ for $0 \leq t \leq M-1$ and $J < V$, or $D_t = K_{t,V}$ for $0 \leq t \leq U$ and $J = V$ (2) $Index_w$: a q-bit wide input bus that indicates the number of valid words in the row, as the row may not be filled entirely with valid keys. This signal causes the locator account only for the row inputs $D_0, D_1, D_2, \ldots, D_W$, and ignore all the inputs from $D_{W+1}$ and above. W may assume one of two possible values:

$W = M-1$ for $J < V$ and $W = U$ for $J = V$.

(3) Key: Searched key K.

The Column Locator outputs are:

(4) $Index_C$: This q-bit wide bus designates the column number I which may contain the searched key. The following formula determines the q value:

$q = \text{Ceil}\{\log_2 M\}$, where $\text{Ceil}\{x\}$ denotes the ceiling of x.

(5) $M_x$: When this signal is "1", an exact match is indicated, that is, one of the row keys exactly matches the searched key.

Table 2 lists all the combinations that the Row Locator outputs and the respective interpretations thereof.

TABLE 2

Column Locator Outputs and Interpretations Thereof

| $Index_C$ | Mx | Interpretation |
|---|---|---|
| $0 \leq Index_C \leq W$ | "0" | The number I indicated by $Index_C$ designates a column key $K_{I,J}$ that is smaller than the searched key and is therefore the matching key. |

TABLE 2-continued

Column Locator Outputs and Interpretations Thereof

| Index$_C$ | Mx | Interpretation |
|---|---|---|
| $0 \leq$ Index$_C \leq$ W | "1" | $K_{I,J}$ matches exactly the searched key, where I is the column number indicated by Index$_C$ |
| Index$_C =$ W | "0" | The searched key is larger than $K_{W,J}$, and therefore $K_{W,J}$ is the matching key. |

The Column Locator consists of a set of comparators, such as 1101, each of which compares the key K with one the entries in row J (for $i \leq W$), and an Encoder (1102). Each comparator issues two signals:

GT: This signal is "1" when $In_2 > In_1$, otherwise it is "0".
EQ: This signal is "1" when $In_2 = In_1$, otherwise it is "0".

The main function of the Encoder is to issue Index$_C$=I, where I is determined by the following formulas:

$$K_{I,J} \leq Key < K_{I+1,J} \text{ for } I<W \text{ , or}$$

$$Key \geq K_{I,J} \text{ for } I=W$$

where $$W=M-1 \text{ for } J<V \text{ or}$$

W=U for J=V.

The Encoder uses the input W value on Index$_W$ to account for all the comparator outputs, in all the comparators connected to $D_0, D_1, D_2, \ldots, D_W$, and ignores those connected to $D_{W+1}$ and above.

If Key=$K_{I,J}$, then the EQ output of Comparator I detects an exact match ("1") and the Encoder issues $M_x$="1". If Key>$K_{I,J}$, then $M_x$="0" is issued and column I is detected by the GT output of Comparator I. In either case Index$_C$ designates the row J.

If the Key is larger than the last key in the row, $K_{W,J}$, then this is the matching key.

Index$_C$=I is used to access the Associated Data List and the Associated Boundary Type List. The Associated Data List issues the value $D_{I,J}$ and the Associated Boundary Type List issues the value $M_{I,J}$ which determines the validity of the range and the associated value $D_{I,J}$.

$M_{I,J}$="1"designates a closed boundary corresponding to a valid range, and $M_{I,J}$="0"designates an open boundary corresponding to a range which is not valid.

The next section describes the Insert operation. This operation requires a preliminary search for locating the row and column for key insertion that is similar to the key search described in this section.

Keeping the Key List in Order—Insert and Remove Operations

Keeping the Key List in order is the basic principle behind the implementation of the key search algorithms presented hereinabove. Since keys are being inserted or removed, the Key List must be updated from time to time. The straightforward way to update the keys is by applying a serial and lengthy algorithm. This requires sequential readout and update of all the Key List entries. Using this approach, the insertion or removal of a key may take approximately:

$$t_E \approx t_R \approx 2 \cdot [(V+1) \cdot M + U + 1] \cdot T + t_S$$

where:
$t_E$ is the Insert time
$t_R$ is the Remove time
$t_S$ is the Search time for the Insert or Remove operations
V is the index of the Key List last row
M is the number of keys in a row
U is the index of the Key List last column
T is the RAM clock cycle For many applications, the insertion and removal described above is cumbersome, and the characteristic times associated with these operations is overly long.

The algorithms described below are based on the implementation of the TDA structure with a w-bit wide RAM. Since each RAM word consists of M keys, the Key List can be readout and written in steps of M keys.

Preliminary Search for the Insert and Remove Operations

Prior to the key insertion/removal, a Search procedure determines the position where the submitted Key $K_E$ is to be inserted or removed, provided that these operations are allowed. Key insertion is allowed only if the key is not included in the TDA, whereas key removal is possible only if it is already included in the TDA.

Locating the Position Index of the New Key for Insertion

Since all the inserted keys are different, the following cases may occur:

Case 1: $K_E < K_{0,0}$
In this case, the new key must be inserted right at the beginning of the list. All the other list entries have to be shifted one location forward.

Case 2: $K_E > K_{U,V}$
In this case, the new key is simply appended at the end of the list.

Case 3: $K_{M-1,J-1} < K_E < K_{0,J}$
In this case, the key has to be inserted just in the beginning of row J.

Case 4: $K_{I-1,J} < K_E < K_{I,J}$
In this case, the key has to be inserted inside row J.

The Search algorithm that precedes the Insert and Remove operations (FIG. 12) is used to locate the position where the submitted key has to be inserted or removed, as necessary. This algorithm is similar to the Two-Step Search algorithm (FIG. 7) described above, but, unlike the Two-Step Search algorithm, which determines the validity of the identified range and associated data, this algorithm determines the index of the key to be inserted or removed, provided that these operations are allowed. Key insertion is allowed only if the key is not included in the TDA ($M_{Exact}$="0"), whereas key removal is possible only if it is already included in the TDA ($M_{Exact}$="1"). The Search algorithm is described below for the Insert operation in reference to FIG. 12. The Remove operation is described below.

In the first step of the Insert Search algorithm, the submitted key to be inserted is loaded (1201). The submitted key is then compared with the lowest key, $K_{0,0}$ (1202). If Key<$K_{0,0}$, the search ends with the designation of the index (0,0) for the inserted key (1203). If Key$\geq K_{0,0}$, the submitted key is compared with the largest key $K_{U,V}$ (1204). If Key>$K_{U,V}$, the algorithm checks whether the largest key lies in the last column (1205). If U=M−1, then index (0,V+1) is assigned to the inserted key (1206). If U<M−1, index (U+1,V) designates the inserted key (1207). Since, in these three cases, the submitted key is clearly not included in the TDA, the signal $M_{Exact}$="0" is issued (1208).

If Key$\leq K_{U,V}$, the submitted key is compared with the largest key in the first column, $K_{0,V}$ (1209). If Key$\geq K_{0,V}$, the target row is identified as row V (1210). The submitted key is then compared with each entry in row V (1211). The row entry $K_{I,V}$ with the largest index I that meets the condition Key$\leq K_{I,V}$ for $0 \leq I \leq U$ is the key that precedes the inserted key. If Key>$K_{I,V}$ (1212), then insertion is possible. The index of the inserted key is given by the formulas V:=V+(I+1)·DivM and I:=(I+1)·ModM (1213); this index is (I+1, V) for I<M−1 and (0,V+1) for I=M−1. The signal $M_{Exact}=$ "0" is issued as well (1214).

If Key<$K_{0,V}$ (1209), the submitted key is compared with the entries of the first column to find the row with the largest index J that meets the condition Key≦$K_{0,J}$ for 0≦J≦V (1217). The submitted key is then compared with each entry in row J (1218). The row entry $K_{I,J}$ with the largest index I that meets the condition Key≧$K_{I,J}$ for 0≦I≦M−1 precedes the inserted key. If Key>$K_{I,J}$ (1219), the Insert operation proceeds. The inserted key index is given by the formulas J:=J+(I+1) DivM and I:=(I+1) ModM (1220); this index is (I+1,J) for I<M−1 and (0,J+1) for I=M−1. The signal $M_{Exact}=$"0" is also issued (1221).

The requirements for locating the row and column for key insertion are similar to those for locating the row and column during key search. Therefore, the Insert Row and Column Locators required are very similar to the Search Row and Column Locators depicted in FIG. 10 and FIG. 11, and described hereinabove. Due to this close similarity, no special diagrams are provided for the Insert Row and Column Locators.

Locating the Position Index of the Key for Removal

Figure 12:
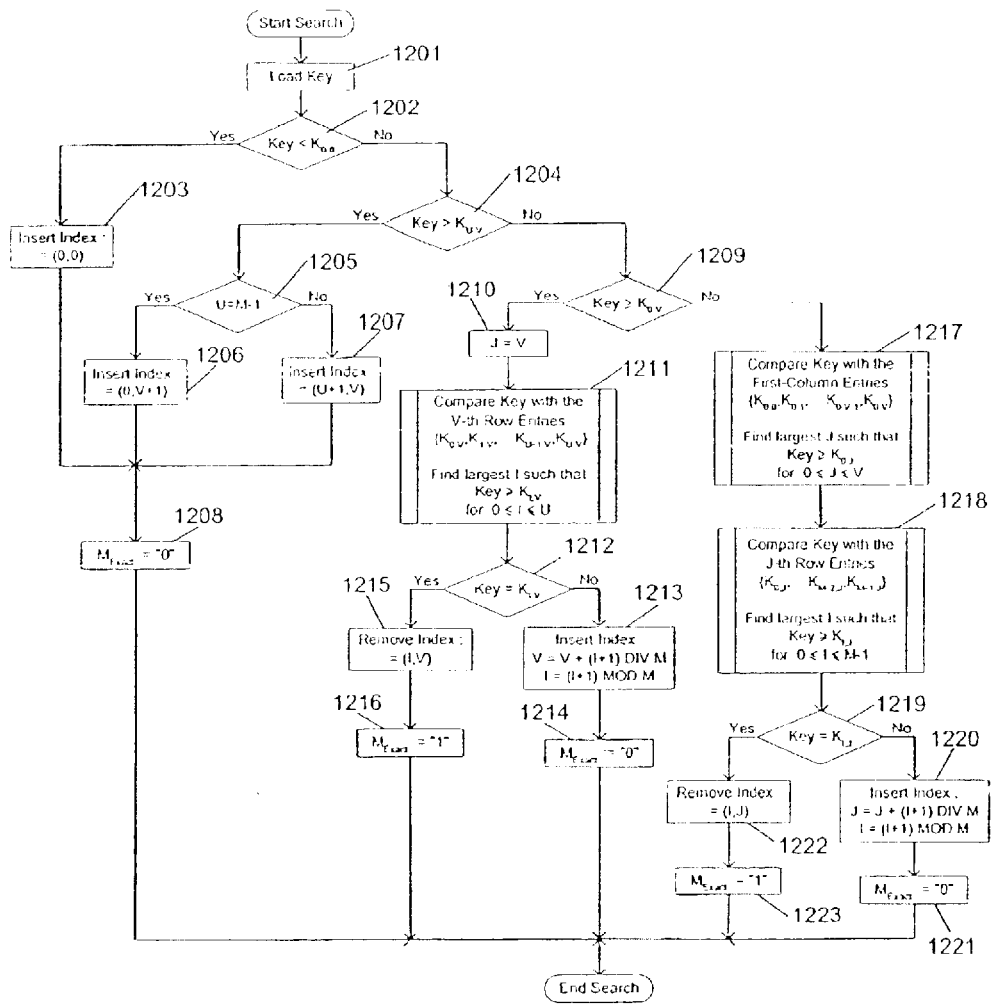
FIG. 12 shows a flowchart for the Search preceding the Key Insert and Remove operations.

The Search algorithm for locating the position of the submitted key that has to be removed is described below in reference to FIG. 12. As mentioned before, key removal is possible only if it is already included in the TDA, i.e., there is an exact key match ($M_{Exact}=$"1").

The Remove algorithm starts by loading the submitted key to be removed (1201). Since this algorithm searches for an exact key match, it requires that $K_{0,0}$≦Key≦$K_{U,V}$, so the searched key does not meet the conditions Key<$K_{0,0}$ (1202) nor Key>$K_{U,V}$ (1204), and it is then compared with the largest key in the first column, $K_{0,V}$ (1209). If Key>$K_{0,V}$, the target row is identified as row V (1210). The submitted key is then compared with each entry in row V (1211). The row entry $K_{I,V}$ with the largest index I that meets the condition Key≧$K_{I,V}$ for 0≦I<U−1, and is included in the TDA (Key=$K_{I,V}$) (1212), is the key that must be removed; it is designated with the index (I,V) (1215). The signal $M_{Exact}=$"1" is issued as well (1216).

If Key<$K_{0,V}$ in step 1209, the submitted key is compared with the entries of the first column to find the row with the largest index J that meets the condition Key≧$K_{0,J}$ for 0≦J≦V (1217). The submitted key is then compared with each entry in row J (1218). The row entry $K_{I,J}$ with the largest index I that meets the condition Key≧$K_{I,J}$ for 0≦I≦M−1 and is included in the TDA (Key=$K_{I,J}$) (1219), is the key to be removed; it is indexed (I,J) (1220). The signal $M_{Exact}=$"0" is also issued (1221).

The requirements for locating the row for key removal are similar to those for locating the row during key search. Therefore, the Remove Row Locator is very similar to the Search Row Locator depicted in FIG. 10 and described above. The Search Column Locator depicted in FIG. 11 and described in the associated text can be used. However, the location of the column for key removal requires an exact key match ("$M_{Exact}=$1"), whereas a key search must match a range. Thus, only the EQ outputs of the Column Locator comparators are necessary. If Key=$K_{I,J}$, then the EQ output of Comparator I only detects an exact match and the Encoder issues $M_x=$"1" (see FIG. 11).

Insert/Remove Supporting Structures

Figure 13:
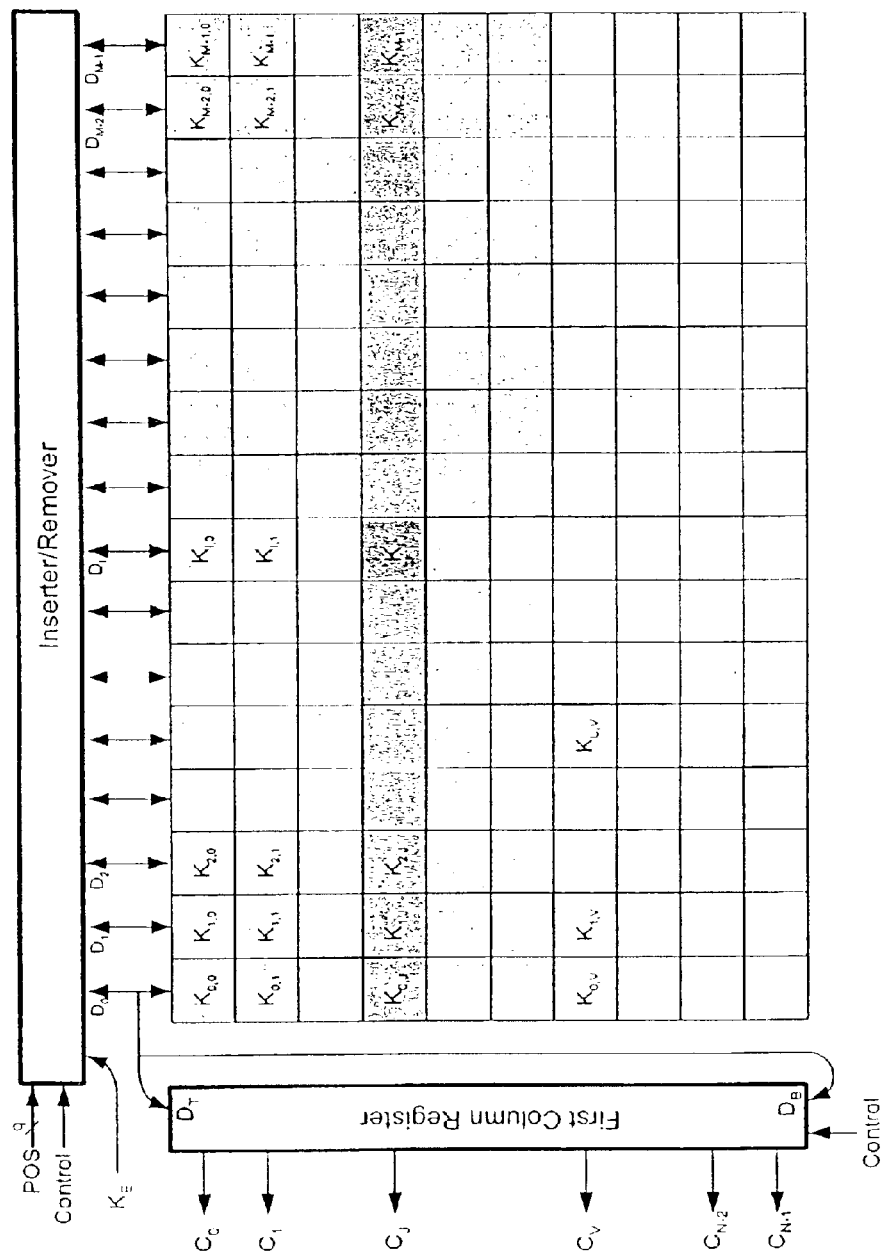
FIG. 13 is a schematic illustration of the TDA and supporting hardware for Key Insertion and Removal.

FIG. 13 shows the TDA and the surrounding hardware which supports the Key insertion and removal. The Inserter/Remover acts on the TDA rows. The basic functions of the Inserter/Remover are:

Insertion of the new key in the appropriate row and column.

Repositioning of the TDA Key List elements as necessary for insertion and removal.

Source for the First Column keys (described below).

The First Column Register is shown in FIG. 9. It operates as a serial input, shift-up or shift-down register. After the completion of an Insert or Remove operation, the content thereof mirrors the TDA First Column. The Inserter/Remover, the First Column Register and their associated operations are described in more detail below.

Inserter/Remover Structure and Operations

Figure 14:
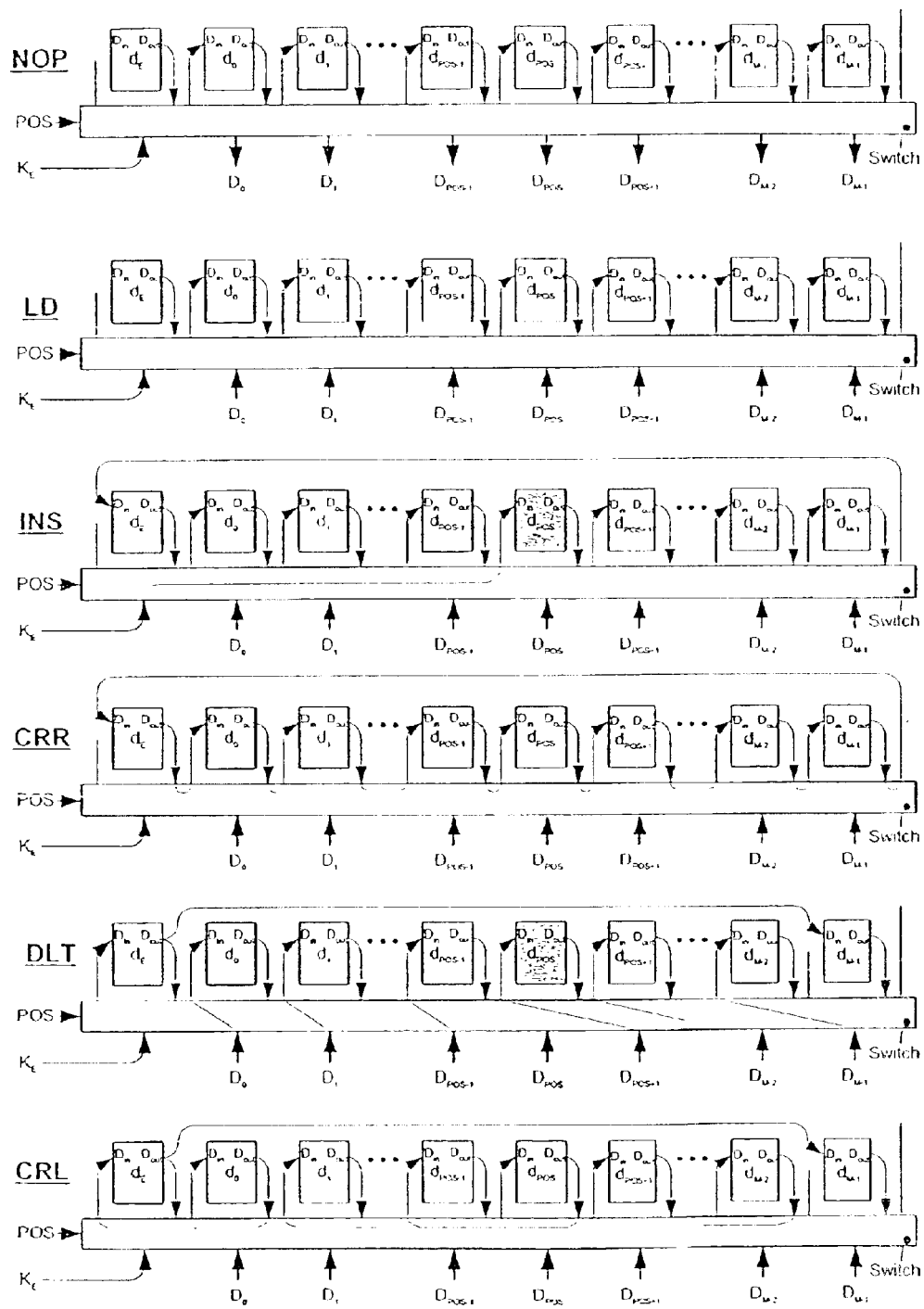
FIG. 14 shows the Inserter/Remover Register interconnections in the six configurations required for the Insert and Remove operations.

The Inserter/Remover consists of M+1 b-bit wide registers. Registers $d_0,d_1,d_2,\ldots,d_{M-2},d_{M-1}$, and register $d_E$ store temporarily and are used to reposition the keys. The interconnections between the registers are controlled by switch hardware. This hardware reconfigures the interconnections to one of the following six configurations as depicted in FIG. 14:

NOP (No Operation): Used for Insert and Remove operations. When NOP is issued, the outputs $D_{out}$ of registers $d_0,d_1,d_2,\ldots,d_{M-2},d_{M-1}$ are connected to the TDA $D_0,D_1,D_2,\ldots,D_{M-2},D_{M-1}$, respectively. The leftmost register $d_E$ is not connected.

LD (Load): Used for Insert and Remove operations. During LD, the inputs $D_{in}$ of registers $d_0,d_1,d_2,\ldots,d_{M-2},d_{M-1}$ are connected to the TDA $D_0,D_1,D_2,\ldots,D_{M-2},D_{M-1}$, respectively, The leftmost register $d_E$ is not connected.

INS($K_E$,POS) (Insert): Used for Insert operation. When INS is applied, the Inserter/Remover is configured to:

Load the new Key $K_E$ into $d_{POS}$ as defined by the POS bus.

Load $D_{POS}, D_{POS+1}, \ldots, D_{M-2}, D_{M-1}$ into $d_{POS+1}, d_{POS+2}, \ldots, d_{M-1}, d_E$, respectively.

Load $D_0, D_1, D_2, \ldots, D_{POS-2}, D_{POS-1}$ into $d_0, d_1, d_2, \ldots, d_{POS-2}, d_{POS-1}$, respectively.

This operation results in all the keys smaller than the inserted key being left in the same position, and all the keys larger than the inserted key being shifted one position forward. The rightmost key is temporarily stored to be appended as the leftmost key in the next row in sequence.

CRR (Circulate to the Right): Used for Insert operation. This operation shifts forward in circle the positions of all the keys. At the end of this operation, $d_E, d_0, d_1, d_2, \ldots, d_{M-2}, d_{M-1}$ reside in $d_0, d_1, d_2, \ldots, d_{M-2}, d_{M-1}, d_E$, respectively. This operation is used to:

Introduce the rightmost key of the preceding row in the sequence, as the leftmost key in the current row.

Shift the row keys one position forward.

Store the rightmost key of the current row in $d_E$ for operation in the next TDA row.

DLT(POS) (Delete): Used for Remove operation. When DLT is applied, the Inserter/Remover is configured to:

Load $D_{POS+1}, \ldots, D_{M-2}, D_{M-1}$, into $d_{POS}, \ldots d_{M-3}, d_{M-2}$, respectively.

Load $D_0, D_1, D_2, \ldots, D_{POS-2}, D_{POS-1}$, into $d_0, d_1, d_2, \ldots, d_{POS-2}$, respectively.

Load the $d_E$ output value (Dout) into $d_{M-1}$.

This operation results in all keys smaller than the deleted key being left in the same position as before, and all keys larger than the deleted key being shifted one position backward. This effectively overrides the value of the key to be removed. The leftmost key of the next row in sequence, stored during the previous operation in $d_E$, is loaded to the rightmost position in the row in which the key removal takes place.

CRL (Circulate to the Left): Used for Remove operation. This operation shifts backward in circle the positions of all the keys in the row. At the end of this operation, $d_0$, $d_1$, $d_2$, ..., $d_{M-2}$, $d_{M-1}$, $d_E$ reside in $d_1$, $d_0$, $d_1$, $d_2$, ..., $d_{M-2}$, $d_{M-1}$, respectively. This operation is used to:

Introduce the leftmost key of the next row in sequence as the rightmost position key in the current row.

Shift the row keys one position backward.

Store the leftmost most key of the current row in $d_E$ for operation in the preceding TDA row.

The above Inserter/Remover operations will be applied during insertion and removal, and will be used in their algorithmic flowcharts.

First Row Column Register Structure and Operations

Figure 15:
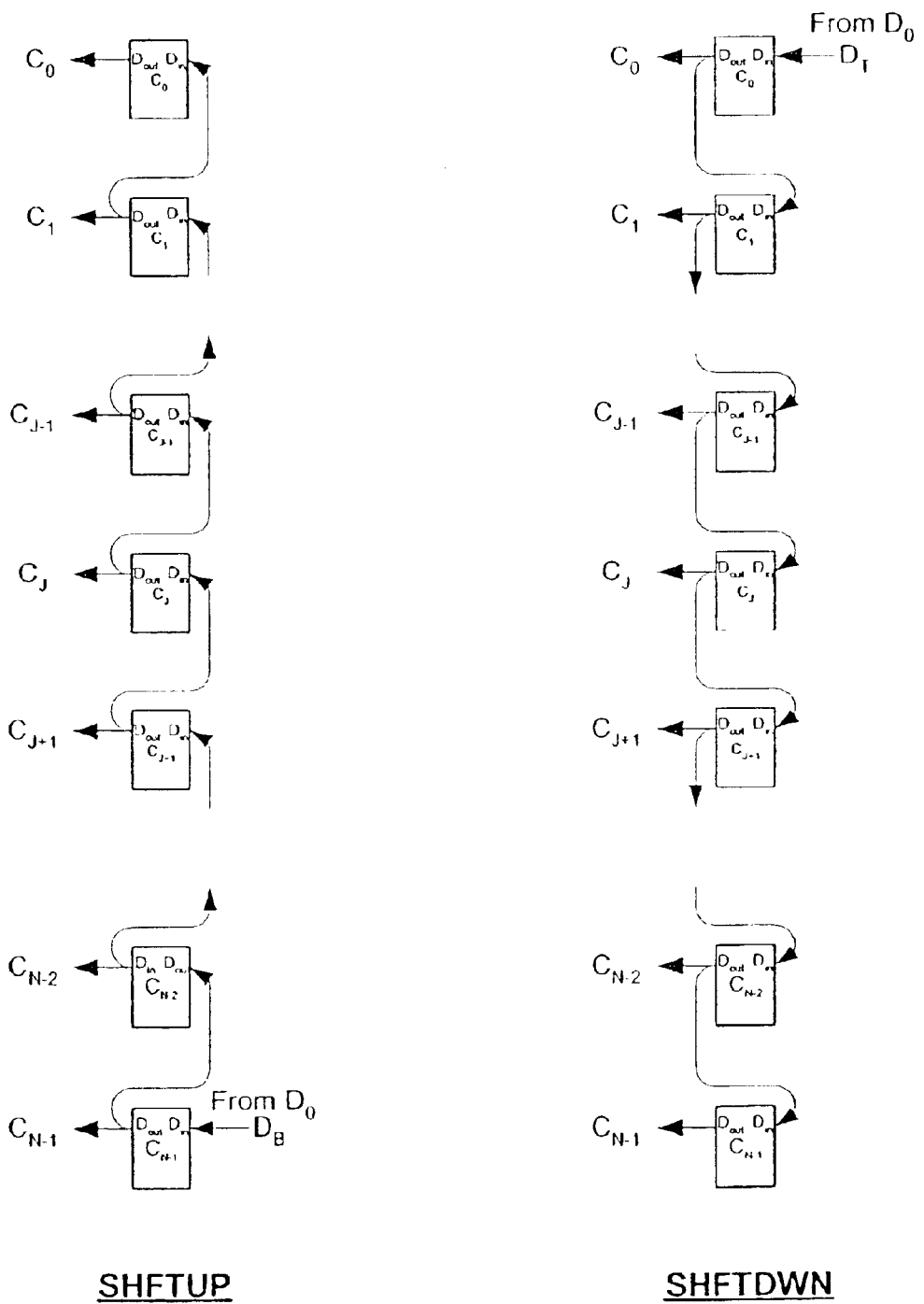
FIG. 15 is a schematic illustration of First Column Register structure and shift configurations for the Insert and Remove operations.

FIG. 15 describes the First Column Register, and the structure and configurations thereof, in the context of the Insert and Remove operations.

The First Column Register consists of N b-bit wide registers, which mirror the content of the First Column. This register performs two shift operations. It copies the new leftmost column value from $D_0$ when the processed row is written back into the TDA. The new value is either written to the bottom cell or to the top cell for Insert and Remove operations, respectively.

SHFTUP (Shift-Up): Used for Insert operation. During SHFTUP, $D_B$ serves as input and copies $D_0$ into the $c_{N-1}$ register, while $c_{N-1}, c_{N-2}, C_{N-3}, \ldots, c_1$ are copied into $c_{N-2}, c_{N-3}, \ldots, c_1, c_0$, respectively. After shift-up, the key previously residing in register $c_0$ is wasted.

SHFTDWN (Shift-Down): Used for Remove operation. During SHFTDWN, $D_T$ serves as input and copies $D_0$ into the $c_0$ register, while $c_0, c_1, c_2, \ldots, c_{N-2}$ are copied into $c_1, c_2, \ldots, c_{N-2}, c_{N-1}$, respectively. After shift-down, the key previously residing in register $c_{N-1}$ is wasted.

Insert Operation

Before describing the Insert operation in general terms, a specific example will first be presented.

EXAMPLE 1

Insertion of the Key 56 into a 5×8 TDA

Figure 16:
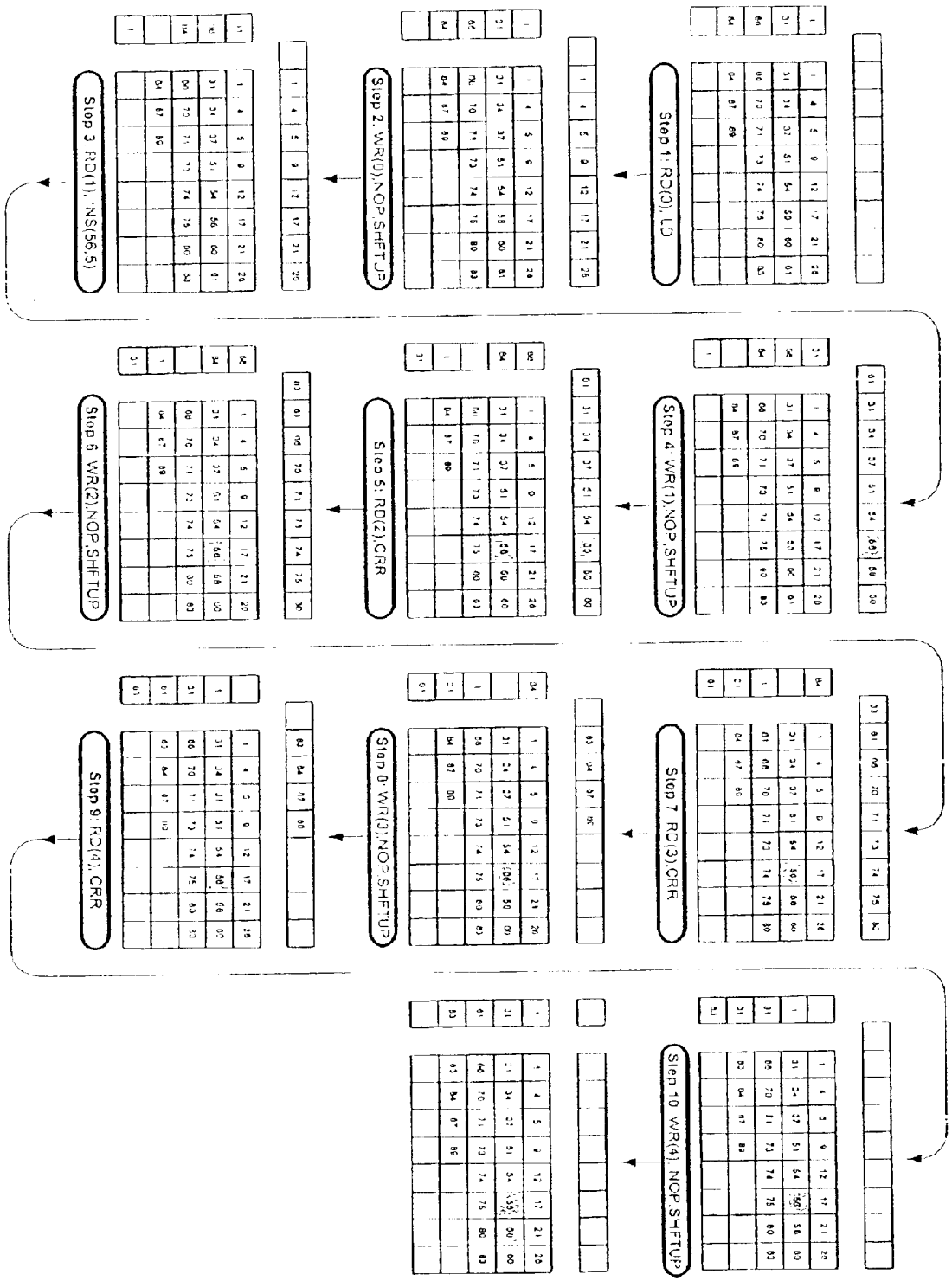
FIG. 16 is a schematic illustration of a 5×8 TDA, First Column Register and Inserter/Remover in the process of Inserting 56 in the TDA.

The insertion of the key 56 in a 5×8 TDA demonstrates the entire Insert procedure. FIG. 16 shows the TDA, the First Column Register and the Inserter/Remover after each step.

The initial state of the TDA is depicted in the upper leftmost corner of FIG. 16. Each step consists of concurrent actions performed on a single TDA row, an Inserter/Remover operation, and a First Column Register operation.

Since the TDA is actually a RAM structure, the only two operations that may be performed in the TDA are:

RD(j): Read row number j.
WR(j):Write to row number j.

The Read and the Write operations are performed from/to the Inserter/Remover.

The Insert operation starts with a search to locate the position in which the key 56 must be inserted in the TDA Key List. This position is in row number 1 and column number 5 (second row and sixth column, respectively). The operation consists of a series of steps involving TDA reads followed by writes, starting with row 0 and ending with row 4 (first and last rows, respectively).

The Inserter/Remover operations differ based upon the location of the manipulated row:

For j<1, the readout rows (one row in this case) are simply loaded into the Inserter/Remover using the LD operation. This operation leaves these rows unmodified.

For j=1, the insertion of the new key, 56, involves INS(56,5) of the readout row number 1.

For j>1, the row readout is accompanied by the Inserter/Remover CRR operation. This shifts all the keys one position to the right and saves the rightmost key in $d_E$ to be introduced in the leftmost position (0) of the next row.

Writing in the TDA row from the Inserter/Remover by NOP is accompanied by SHFTUP of the First Column Register. This writes back the unmodified or modified row into the TDA and updates the First Column Register by copying the new First Column key from the Inserter/Remover $D_0$ output.

Excluding the Search procedure, the Insert operation takes 10 steps altogether.

Generalized Insert Algorithm

Figure 17:
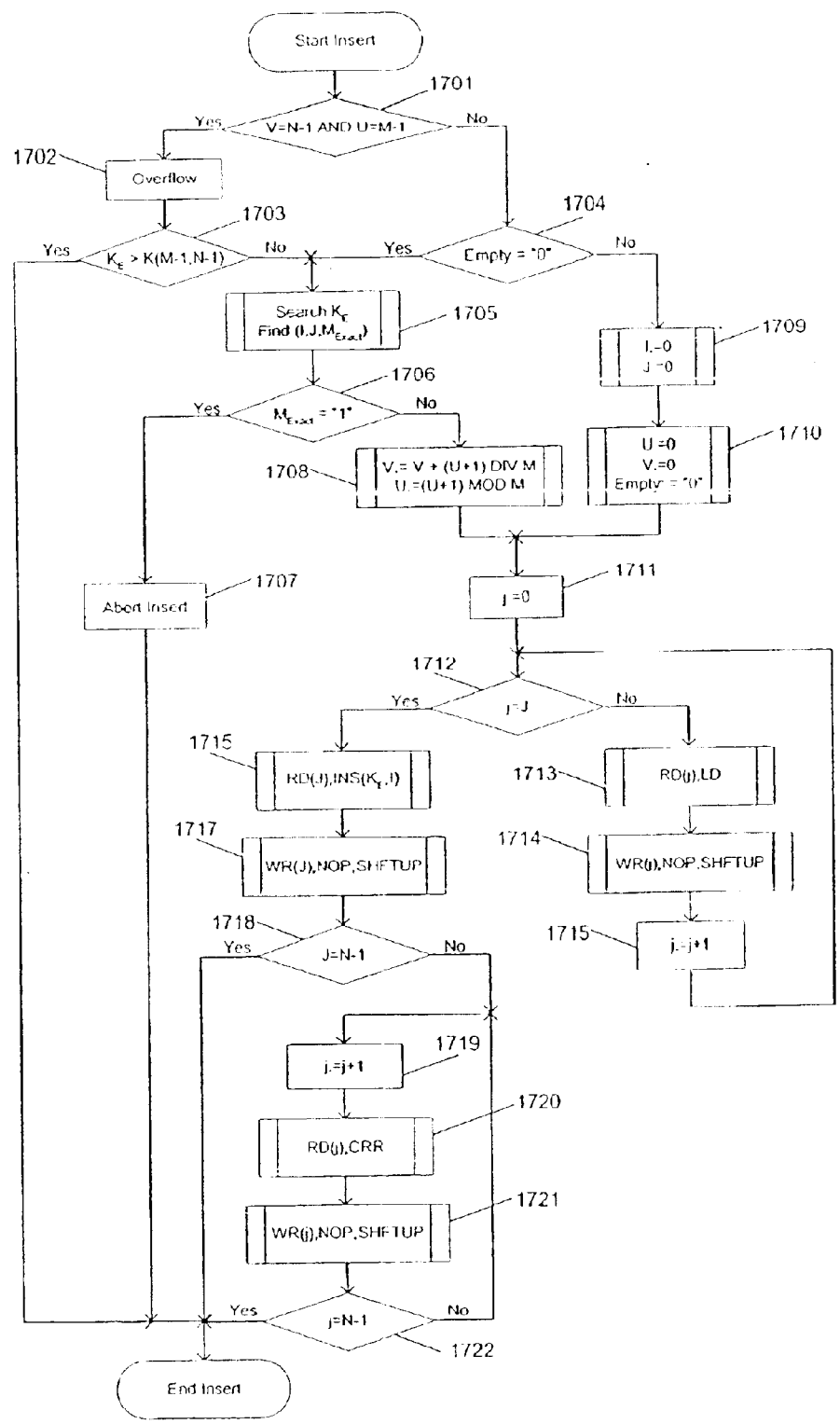
FIG. 17 shows a flowchart for the Insertion of a Key in the TDA.

The generalized Insert algorithm corresponding to the specific Insert procedure (shown in FIG. 16) is depicted in FIG. 17.

In the first step, the TDA is checked to find out whether it can fit additional entries (1701). If V=N−1 and U=M−1, then the TDA is full and an Overflow condition is declared (1702). If $K_E > K_{M-1,N-1}$ in step 1703, then there is no room for the submitted key to be inserted $K_E$, and the operation is terminated without insertion. If $K_E < K_{M-1,N-1}$ the new key can be inserted, but entry $K_{M-1,N-1}$ will be pushed out from the TDA as the result of the insertion. After the initial checkup for fullness (1701), the TDA is checked for emptiness (1704). If found not empty (Empty="0"), the Insert Search procedure takes place. This procedure identifies the position (I,J) of the key that precedes the inserted key $K_E$ in the TDA (1705) and assigns the next index to $K_E$; this index is (I+1,J) for I<M−1 and (0,J+1) for I=M−1. It also provides the signal $M_{Exact}$ that indicates whether the submitted key is included in the TDA ($M_{Exact}$="1"). This signal is checked (1706), and if it indicates this condition, then the Insert operation is aborted (1707). If the submitted key is not listed ($M_{Exact}$="0"), the key insertion proceeds. The last entry index (U,V) in the TDA is updated (1708), so that, if it is currently located in the last column (U=M−1), then V=V+1 and U=0; if U<M−1, then V remains unchanged and U=U+1. If the TDA is empty (Empty="1"), in step 1704, $K_E$ is indexed (0,0) in step 1709. Then, in step 1710, U and V are set to 0, and the TDA is redefined to be not empty (after the insertion). The key search and last entry index update are followed by step 1711 which starts the Insert operation.

In step 1711, the pointer is directed to the first row (j=0). The row index j is then compared with J (1712). If j<J, row j is read and loaded into the Inserter/Remover (1713). In step 1714, row j is written back into the TDA, the Inserter/Remover cells remain unchanged, whereas the First Column Register cells are updated by shifting each entry one position upwards and copying the key $K_{0,j}$ into the last cell $C_{N-1}$ of this register. The pointer is then advanced to the next row (1715) and returned to comparison step 1712. Steps 1712 to 1715 are repeated for each subsequent row, until the pointer reaches row J.

If j=J (in step 1712), then, in step 1716, row J is read and loaded into the Inserter/Remover, and key $K_E$ is inserted into the cell (I+1,J), while all the subsequent keys in row J are shifted one position forward (to the right) and the rightmost key in row J is stored in the leftmost cell $d_E$ of the Inserter/Remover (to be appended as the leftmost entry in the next row). In step 1717, row J is written back into the TDA whereas the First Column Register cells are updated by shifting each entry one position upwards and copying the key $K_{0,j}$ into the last cell $C_{N-1}$ of this register.

In step 1718, index J of the row where $K_E$ is inserted is compared with N−1 (last row index). If J=N−1, the Insert operation is terminated. If J<N−1, the pointer is advanced to the next row (1719). In step 1720, the next row (starting from row J+1) is read and loaded into the Inserter/Remover. All the Inserter/Remover entries are shifted one position forward (to the right), with the rightmost row entry in $d_{M-1}$ shifted backwards and stored in $d_E$ for operation in the next row. In step 1721, the next row j is Written back into the TDA while the First Column Register cells are updated by shifting each entry one position upwards and copying the key $K_{0,j}$ into the last cell $C_{N-1}$ of this register. Finally, in step 1722, the index j of the next row is compared with N−1 (index of the last row). If j=N−1, the Insert operation is terminated. If j<N−1, steps 1718 to 1721 are repeated until the last row is reached.

In this way, all the keys smaller than the inserted key $K_E$ remain in the same position whereas all the keys larger than $K_E$ advance in one position.

The Insert operation is completed in time $t_E$, where $$t_E = 2 \cdot (N+1) \cdot T + t_S$$

This time is significantly less than the time required to perform sequential readout and update of all the Key List entries, which may take approximately (for insertion or removal of a key):

$$t_E \approx t_R \approx 2 \cdot [(V+1) \cdot M + U + 1] \cdot T + t_S$$

Remove Operation

Before describing the Remove operation in general terms, a specific example will first be presented.

EXAMPLE 2

Removal of the Key 58 from a 5×8 TDA

Figure 18:
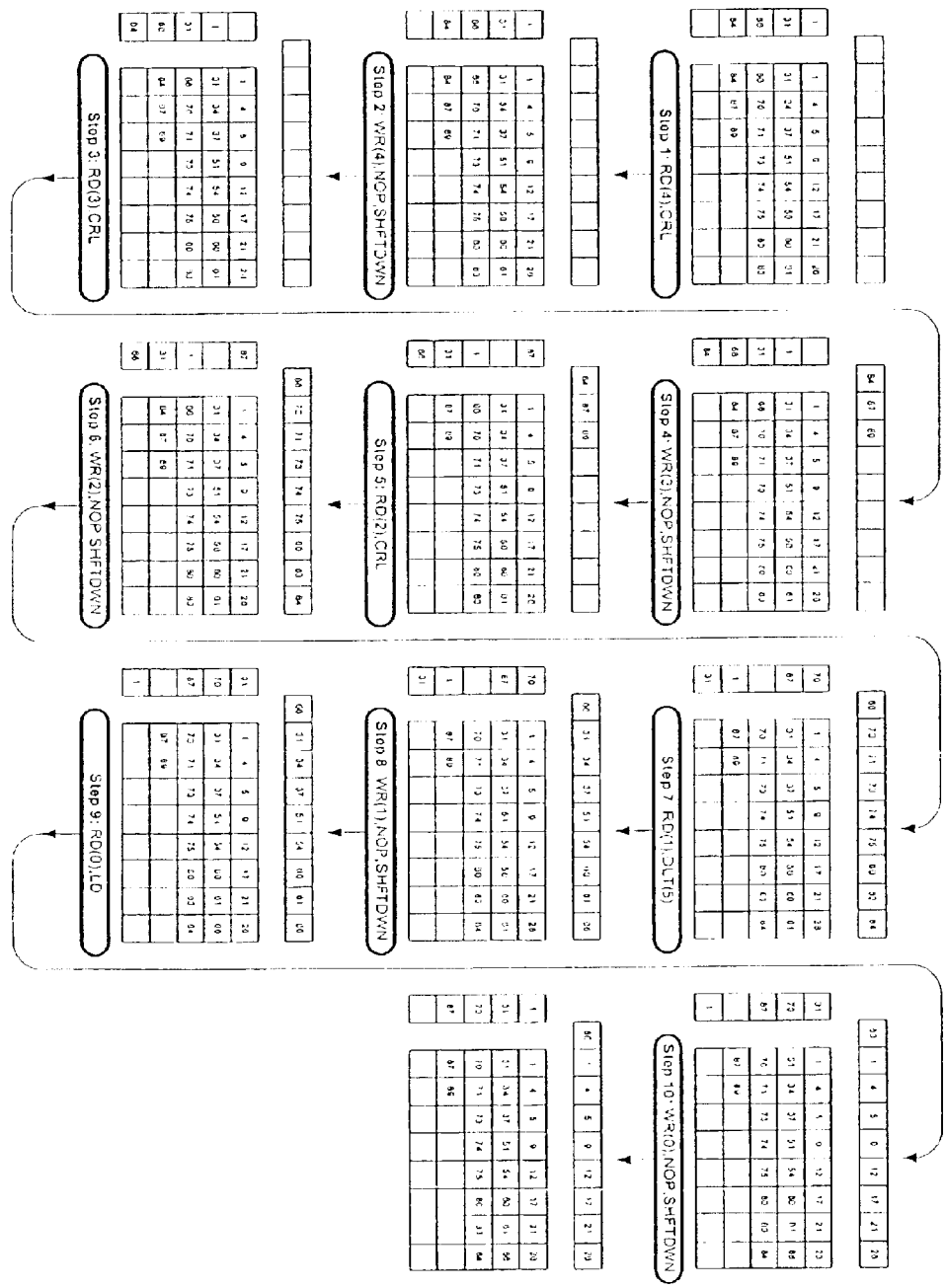
FIG. 18 is a schematic illustration of a 5×8 TDA, First Column Register and Inserter/Remover in the process of Removing 58 from the TDA.

The removal of the key 58 from a 5×8 TDA exemplifies the entire Remove procedure. FIG. 18 shows the TDA, the First Column Register and the Inserter/Remover after each step.

The initial state of the TDA is shown in the upper leftmost corner of FIG. 18. Similarly to the Insert operation, each step consists of a concurrent read or write performed on a single row of the TDA, an Inserter/Remover operation, and a First Column Register operation.

The Remove operation starts with a Search operation to locate the position of the key 58 to be removed from the TDA Key List. This position is in row number 1 and column number 5 (second row and sixth column, respectively). The operation involves a series of steps involving TDA reads followed by writes, starting with row 4 (the last row), going backwards and ending with row 0 (first row).

The Inserter/Remover operations differ based upon the location of the manipulated row:

For $1 < j \leq N-1$, the row readout is accompanied by the Inserter/Remover CRL operation. This shifts all the keys one position to the left and saves the leftmost key in $d_E$ to be introduced in the rightmost position (M−1) of the preceding row.

For j=1, the deletion of key 58 involves DLT(58) in row number 1.

For j<1, the row readout is accompanied by the Inserter/Remover LD operation. This operation leaves these rows unmodified.

Writing in the TDA row from the Inserter/Remover by NOP is accompanied by SHFTDWN of the First Column Register. This writes back the modified or the unmodified row into the TDA, and updates the First Column Register by copying the new First Column keys from the Inserter/Remover $D_0$ output.

Excluding the Search procedure, the Remove operation takes 10 steps altogether.

Generalized Remove Algorithm

Figure 19:
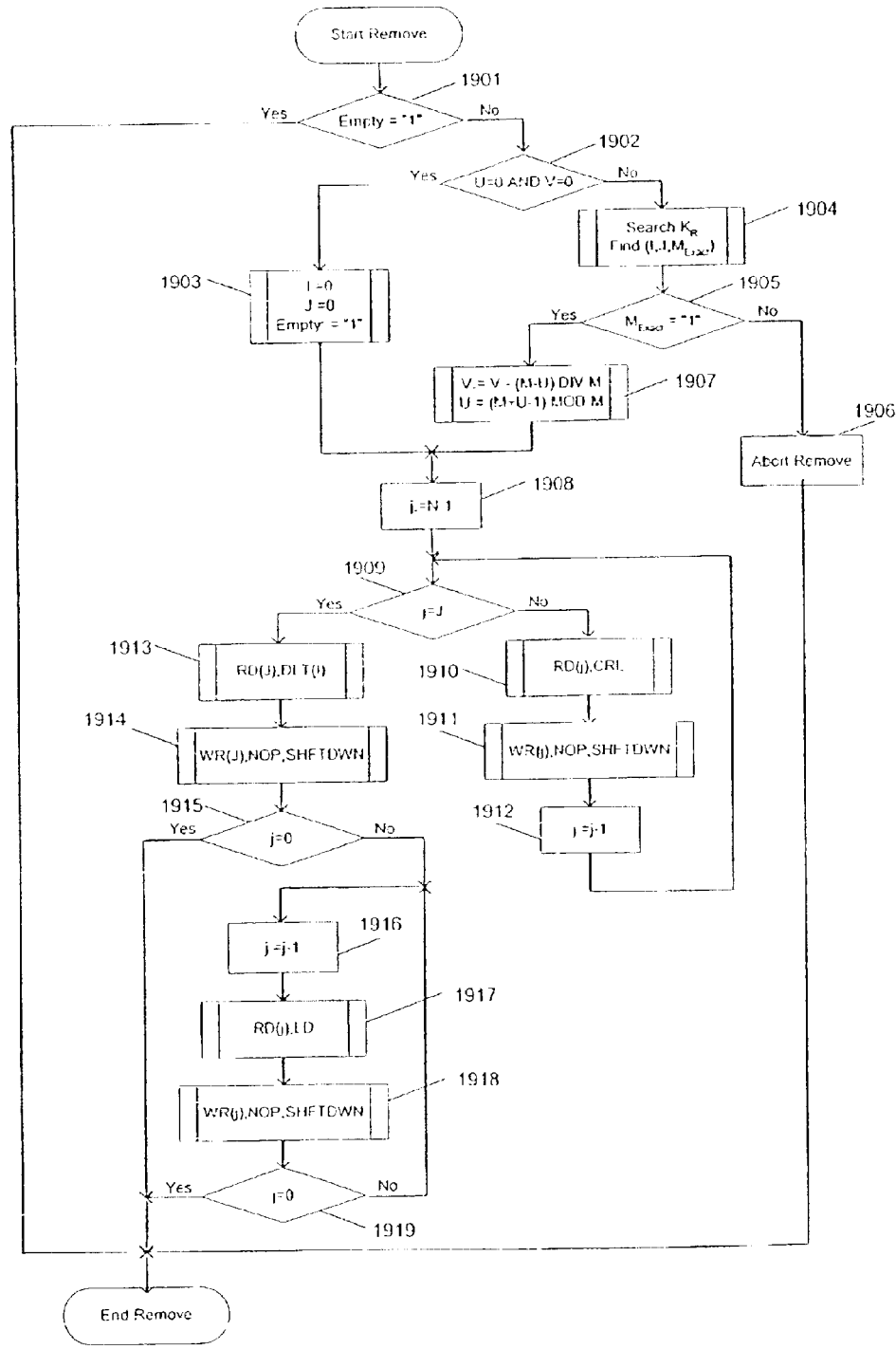
FIG. 19 shows a flowchart for the Removal of a Key in the TDA.

The generalized Remove algorithm corresponding to the specific Remove procedure (shown in FIG. 18) is depicted in FIG. 19.

In the first step, the TDA is checked to determine whether it is empty (Empty="1") (1901). If so, the operation is terminated without removal. If the TDA is not empty (Empty="0"), the TDA is checked determine whether it contains only a single entry (U=0 and V=0) (1902). If so, in step 1903, the key to be removed $K_R$ is indexed (0,0) and the TDA is redefined to be empty (Empty="1") after the removal. If the TDA contains more than one entry, the Remove Search procedure identifies the position (I,J) of the key to be removed $K_R$ (1904). It also provides the signal $M_{Exact}$ that indicates whether the key to be removed is included in the TDA ($M_{Exact}$="1"). This signal is checked (1905), and if it indicates otherwise ($M_{Exact}$="0"), the Remove operation is aborted (1906). If the key is listed, then the key removal proceeds. The last entry index (U,V) in the TDA is updated (1907), so that, if it is currently located in the first column (U=0), then V=V−1 and U=M−1; if U>0, then V remains unchanged remains unchanged and U=U−1. The key search and last entry index update are followed by step 1908, which starts the Remove operation.

In step 1908, the pointer is directed to the last row (j=N−1). The row index j is then compared with J (1909). If j>J, then, in step 1910, row j is read and loaded into the Inserter/Remover. All the Inserter/Remover entries are shifted one position backwards (to the left), with the entry in $d_E$ shifted to the rightmost entry in $d_{M-1}$. The leftmost row entry in $d_0$ is shifted to $d_E$ and stored for operation in the preceding row. In step 1911, row j is written back into the TDA, the Inserter/Remover cells remain unchanged, whereas the First Column Register cells are updated by shifting each entry one position downwards and copying the key $K_{0,j}$ into the first cell $C_0$ of this register. Then, the pointer is advanced to the preceding row (j−1) (1912) and returned to the comparison step 1909. Steps 1909 to 1912 are repeated for each subsequent row, until the pointer reaches row J.

If j=J (in step 1909), then, in step 1913, row J is read and loaded into the Inserter/Remover, key $K_R$ in cell (I,J) is removed, and all the keys larger than $K_R$ are shifted one position backwards (to the left). The leftmost key of the next row (J+1) stored in $d_E$ is shifted to the rightmost entry in $d_{M-1}$ of the Inserter/Remover. In step 1914, the modified row J is written back into the TDA whereas the First Column Register cells are updated by shifting each entry one position downwards and copying the key $K_{0,J}$ into the first cell $C_0$ of this register.

In step 1915, row index j is compared with 0 (first row index). If j=0, the Remove operation is terminated. If J>0, the pointer is advanced to the preceding row (j−1) (1916). In step 1917, the preceding row is read and loaded into the Inserter/Remover. In step 1918, the preceding row is written back into the TDA while the First Column Register cells are updated by shifting each entry one position downwards and copying the key $K_{0,j}$ into the first cell $C_0$ of this register. Finally, in step 1919, the index j of the preceding row is compared with 0 (index of the first row). If j=0, the Remove operation is terminated. If j>0, steps 1916 to 1918 are repeated until the first row is reached.

In this way, all the keys smaller than the removed key $K_R$ remain in the same position whereas all the keys larger than $K_R$ recede by one position.

The Remove operation is completed in time $t_R$, where $$t_R = 2 \cdot (N+1) \cdot T + t_S$$

This time is significantly less than the time required to perform sequential readout and update of all the Key List entries, which may take approximately (for insertion or removal of a key):

$$t_E \cong t_R \cong 2 \cdot [(V+1) \cdot M + U + 1] \cdot T + t_S$$

Insert and Remove Operations in the TDAs for the Associated Data and the Associated Boundary Type The indices of the TDAs for the Associated Data and the Associated Boundary Type must remain in correspondence with the key index. Therefore, the Insert and Remove operations in the Key List TDA must be accompanied by corresponding, simultaneous and identical Insert and Remove operations in the TDAs for the Associated Data and the Associated Boundary Type.

Update Operation

The Update Operation consists in changing the Associated Data and the Associated Boundary Type for a specific key in the Key List TDA, without changing the number of keys in the TDA. This operation is generally necessary when an overlapping range (for example, an IPv4 CIDR Address) is inserted in or removed from the TDA. A special algorithm determines whether it is necessary to insert or remove one or more keys, and also whether the boundary type and the associated data entries corresponding to the TDA keys change as a consequence. Usually, the potential insertion or removal of keys following the insertion or removal of an overlapping range is accompanied by the update of the corresponding boundary type and associated data entries.

Density and Performance Factors

Density

The number of comparators is a good indicator of the overhead. It is easy to figure out that the number of comparators used with the RAM-based TDA approach presented here is only a fraction of the number of comparators in a conventional CAM. This fraction Fc is:

$$Fc = \frac{1}{N} + \frac{1}{M}$$

For instance, if the number of CAM entries is 1024 and it is implemented as 32×32 TDA, it will have only 6.25% of the number of comparators of a conventional CAM. Furthermore, the RAM-Based CAM can use a state-of-the-art RAM technology, which provides additional density benefits.

The density gain that can be accomplished is estimated to be in the range of 4 to 8 for a similar SRAM-based CAM and is even much better for a DRAM-based CAM.

Performance

The performance of the RAM-based RCAM of the present invention can be evaluated in terms of search throughput and latency, and in terms of list maintenance time.

Throughput

For many applications, such as data communications, throughput is the most important performance factor. For a pipelined search (as developed hereinabove), $$f_s^P = f_c = \frac{1}{T}$$

such that the performance equals that of a conventional CAM in terms of steps per search.

However, for the optimized RAM structure, it is estimated that the circuits will be much faster, as fast as the fastest RAM available.

Latency

Theoretically, the conventional CAM has a lower latency time in terms of the number of steps. It takes two steps for the RAM-based RCAM to complete a Search as compared to a single step for a conventional CAM. However, the RAM-based RCAM can operate on a much faster clock in a pipelined fashion, which overcompensates for the larger number of steps.

Key List Maintenance

The Insert and Remove operations undergo sequential steps completed in the same time periods given by the following formulas:

$$t_E = 2 \cdot (N+1) \cdot T + t_S \text{ and}$$

$$t_R = 2 \cdot (N+1) \cdot T + t_S$$

With the RAM-based approach, the Key List Maintenance typically consumes hundreds of nanoseconds. This is slower than for the fastest conventional CAM. However, the conventional CAMs leave the Key List in disarray, which results in a unaccounted, but much higher, Key List Maintenance overhead.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method for arranging and storing data in a memory and for extracting the data from the memory in response to an input key, the method comprising the steps of:
   (a) providing at least a first array having at least two dimensions, said first array consisting of rows and columns, said first array for storing a plurality of range boundary information;
   (b) providing at least a second array having at least two dimensions, said second array consisting of rows and columns, said second array for storing a plurality of associated data entries;
   (c) processing sets of range information to produce, for each of said sets:
      (i) range boundary information, said range boundary information including at least one range-boundary value, said range boundary information being associated with a particular one of said associated data entries, and (ii) range validity information, and (d) storing said range boundary information within said first array.

2. The method of claim 1, wherein said range boundary information is a single range-boundary value.

3. The method of claim 2, wherein each said range-boundary value has a unique pair of row and column indices for indicating a unique pair of row and column indices of said particular one of said associated data entries.

4. The method of claim 1, wherein said range validity information corresponding to each set of said sets is a boundary status of said set.

5. The method of claim 4, further comprising the step of:

(e) arranging each said range boundary value in a separate memory cell of said first array, to produce a monotonic order.

6. The method of claim 4, wherein if said boundary status is open, a range defined by said particular range boundary information is an invalid range.

7. The method of claim 4, wherein if said boundary status is closed, a range defined by said particular range key is a valid range.

8. The method of claim 5, wherein each said monotonic order is filled starting from a single row or column.

9. The method of claim 5, wherein said first array is completely filled with said range boundary information.

10. The method according to claim 8, wherein said first array is transposed.

11. The method of claim 1, further comprising the step of:

(e) comparing a value of an input key with said range boundary information to determine a particular range to which said input key belongs.

12. The method of claim 11, further comprising the step of:

(f) if said value of said input key falls within a particular range defined by said range boundary information, determining if said particular range is a valid range.

13. The method of claim 12, further comprising the step of:

(g) if said particular range is a valid range, retrieving from said associated data entries, a data entry associated with said range boundary information of said particular range.

14. The method of claim 12, further comprising the step of:

(g) if said particular range is a valid range, producing a match signal.

15. The method of claim 12, further comprising the step of:

(g) if said range of consecutive values is not a valid range, producing a no-match signal.

16. The method of claim 11, wherein each of said associated data entries has a unique pair of row and column indices for association with a unique pair of row and column indices of a particular one of said range boundary information.

17. The method of claim 11, wherein said range boundary information is a single range-boundary value.

18. The method of claim 17, wherein each said range validity information is contained within said first array, each said range validity information corresponding to a particular said single range-boundary value.

19. The method of claim 12, wherein said range validity information is stored in a separate array.

20. The method of claim 17, wherein each said range validity information is contained within said second array, each said range validity information corresponding to a particular one of said associated data entries.

21. The method of claim 17, wherein said associated range validity information has a unique pair of row and column indices for association with a unique pair of row and column indices of a particular one of said associated data entries.

22. A method for extracting the data from the memory in response to an input key, the method comprising the steps of:

(a) providing at least a first array having at least two dimensions, said first array consisting of rows and columns, said first array having a plurality of range boundary information, each range boundary information corresponding to a particular range;

(b) providing at least a second array having at least two dimensions, said second array consisting of rows and columns, said second array having a plurality of associated data entries, each of said data entries being associated with a particular one of said range boundary information;

(c) providing range validity information for each of said range boundary information;

(d) comparing a value of an input key with said range boundary information to determine a particular range to which said input key belongs.

23. The method of claim 22, further comprising the step of:

(e) if said value of said input key falls within a particular range defined by said range boundary information, determining if said particular range is a valid range.

24. The method of claim 23, further comprising the step of:

(f) if said particular range is a valid range, retrieving from said associated data entries, a data entry associated with said range boundary information of said particular range.

25. The method of claim 23, further comprising the step of:

(f) if said particular range is a valid range, producing a match signal.

26. The method of claim 23, further comprising the step of:

(f) if said range of consecutive values is not a valid range, producing a no-match signal.

27. The method of claim 22, wherein each of said associated data entries has a unique pair of row and column indices for association with a unique pair of row and column indices of a particular one of said range boundary information.

28. The method of claim 22, wherein said range boundary information is a single range-boundary value.

29. The method of claim 28, wherein each said range validity information is contained within said first array, each said range validity information corresponding to a particular said single range-boundary value.

30. The method of claim 23, wherein said range validity information is stored in a separate array.

31. The method of claim 28, wherein each said range validity information is contained within said second array, each said range validity information corresponding to a particular one of said associated data entries.

32. The method of claim 28, wherein a row or column containing said range boundary information is selected by the following steps:

(i) performing a comparison between said range boundary information and said input key to produce a result, and (ii) identifying a row or column in which said result undergoes a change in inequality status.

33. The method of claim 32, further comprising the step of:

(iii) selecting said row or column.

34. The method of claim 22, wherein said memory is selected from the group of memories consisting of: SRAM, DRAM, CCD, ROM, EPROM, E²PROM, Flash memory, and magnetic media.

35. The method of claim 22, wherein a rate of key lookups of said range boundary information is increased by concurrently:
  i) identifying a location of said input key in a row which has been previously identified and selected, and
  ii) identifying and selecting a row that may contain a subsequently submitted input key.

36. The method of claim 28, further comprising the steps of:
  (e) identifying a row into which said new range boundary value should be inserted and selecting said row;
  (f) inserting a new range boundary value into an insertion location in said first array while maintaining a monotonic order of said plurality of range boundary information.

37. The method of claim 36, wherein said identifying in step (e) includes a comparison of said new range boundary value with said range boundary information disposed in an end column in said first array.

38. The method of claim 36, further comprising the step of:
  (g) checking, before step (f), that said new range boundary value is not already enlisted is said first array.

39. The method of claim 36, further comprising the step of:
  (g) identifying a column index for said new range boundary value by performing a comparison of said new range boundary value with said range boundary information disposed in said row.

40. The method of claim 36, wherein said maintaining a monotonic order is achieved by shifting a content of each cell disposed after said insertion location respectively, by one position, thereby completely filling at least a portion of said array with said boundary entries.

41. The method of claim 28, further comprising the steps of:
  (e) identifying a row from which a particular range boundary value should be removed and selecting said row;
  (f) removing said particular range boundary value from a removal location in said first array while maintaining a monotonic order of said plurality of range boundary information.

42. The method of claim 41, wherein said identifying in step (e) includes a comparison of said new range boundary value with said range boundary information disposed in an end column in said first array.

43. The method of claim 41, further comprising the step of:
  (g) checking, before step (f), that said particular range boundary value is enlisted is said first array.

44. The method of claim 41, further comprising the step of:
  (g) identifying a column index for said particular range boundary value by performing a comparison of said particular range boundary value with said range boundary information disposed in said row.

45. The method of claim 41, wherein said maintaining a monotonic order is achieved by shifting a content of each cell disposed after said removal location respectively, by one position, thereby completely filling at least a portion of said array with said boundary entries.

46. A device for storing arranged data in a memory, and for extracting the data therefrom, the device comprising:
  (a) a random access memory including:
    (i) a first array of cells, said first array having at least two dimensions and consisting of rows and columns, said first array containing a plurality of range boundary information, each range boundary information corresponding to a particular range, each of said cells having a unique address and being accessible via an input key;
    (ii) a second array of cells, said second array having at least two dimensions and consisting of rows and columns, said second array having a plurality of associated data entries, and
    (iii) range validity information for each of said range boundary information, said range validity information stored within said memory;
  wherein said memory is designed and configured such that each of said data entries is associated with a particular one of said range boundary information, and
  (b) processing means designed and configured to examine, in response to said input key, said range boundary information, so as to determine if said input key falls within any said range.

47. The device of claim 46, wherein said range boundary information disposed in said first array is a single range-boundary value.

48. The device of claim 47, wherein each said range validity information is disposed in said first array, each said range validity information corresponding to a particular said single range-boundary value.

49. The device of claim 47, wherein said range validity information is stored in a separate array.

50. The device of claim 47, wherein each said range validity information is disposed in said second array, each said range validity information corresponding to a particular one of said associated data entries.

51. The device of claim 46, further comprising:
  (c) sorting means for arranging said range boundary information in monotonic order within said first array.

52. The device of claim 46, said memory being selected from the group of memories consisting of: SRAM, DRAM, CCD, ROM, EPROM, E²PROM, Flash-memory, and Magnetic-media.

53. The device of claim 47, wherein each of said associated data entries has a unique pair of row and column indices for association with a unique pair of row and column indices of a particular one of said range boundary information.

54. The device of claim 46, wherein each of said range validity information has a unique pair of row and column indices for association with a unique pair of row and column indices of a particular one of said associated data entries.

55. The device of claim 46, wherein said processing means include:
  i) a row locator containing at least a first comparator, for comparing contents of an end column of said first array with said input key and for identifying a row that may contain a particular said range boundary information corresponding to a range containing said input key.

56. The device of claim 55, wherein said processing means further include:
  ii) a column locator containing at least a second comparator, for comparing contents of said row with said input key and for identifying a column containing said particular range boundary information corresponding to said range containing said input key.

* * * * *